US011245019B2

(12) United States Patent
Ahn et al.

(10) Patent No.: US 11,245,019 B2
(45) Date of Patent: Feb. 8, 2022

(54) SEMICONDUCTOR DEVICE AND METHOD FOR FABRICATING THE SAME

(71) Applicant: XIA TAI XIN SEMICONDUCTOR (QING DAO) LTD., Qingdao (CN)

(72) Inventors: Woo-Song Ahn, Singapore (SG); Sang-Don Yi, Singapore (SG); Yongchul Oh, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 26 days.

(21) Appl. No.: 16/739,129

(22) Filed: Jan. 10, 2020

(65) Prior Publication Data

US 2021/0217867 A1 Jul. 15, 2021

(51) Int. Cl.
| | |
|---|---|
| *H01L 29/423* | (2006.01) |
| *H01L 29/51* | (2006.01) |
| *H01L 29/66* | (2006.01) |
| *H01L 27/108* | (2006.01) |
| *H01L 49/02* | (2006.01) |

(52) U.S. Cl.
CPC .. *H01L 29/42376* (2013.01); *H01L 27/10814* (2013.01); *H01L 27/10873* (2013.01); *H01L 27/10885* (2013.01); *H01L 29/513* (2013.01); *H01L 29/66545* (2013.01); *H01L 29/66568* (2013.01); *H01L 27/10817* (2013.01); *H01L 28/90* (2013.01)

(58) Field of Classification Search
None
See application file for complete search history.

(56) References Cited

U.S. PATENT DOCUMENTS

| | | | | |
|---|---|---|---|---|
| 6,143,593 | A | * | 11/2000 | Augusto .......... H01L 21/28194 257/E21.191 |
| 6,479,385 | B1 | * | 11/2002 | Jang ................. H01L 21/31625 438/691 |
| 2009/0212372 | A1 | * | 8/2009 | Yamasaki ....... H01L 21/823468 257/369 |
| 2017/0352675 | A1 | * | 12/2017 | Mihara ............ H01L 27/11573 |

* cited by examiner

*Primary Examiner* — Anthony Ho
*Assistant Examiner* — Kevin Quinto
(74) *Attorney, Agent, or Firm* — ScienBiziP, P.C.

(57) ABSTRACT

A semiconductor device includes a substrate, a gate feature, a gate spacer, and a dielectric layer. The gate feature is above the substrate and includes a gate electrode. The gate spacer is on a sidewall of the gate feature. The dielectric layer is in contact with the gate spacer and has a larger thickness than the gate electrode.

10 Claims, 23 Drawing Sheets

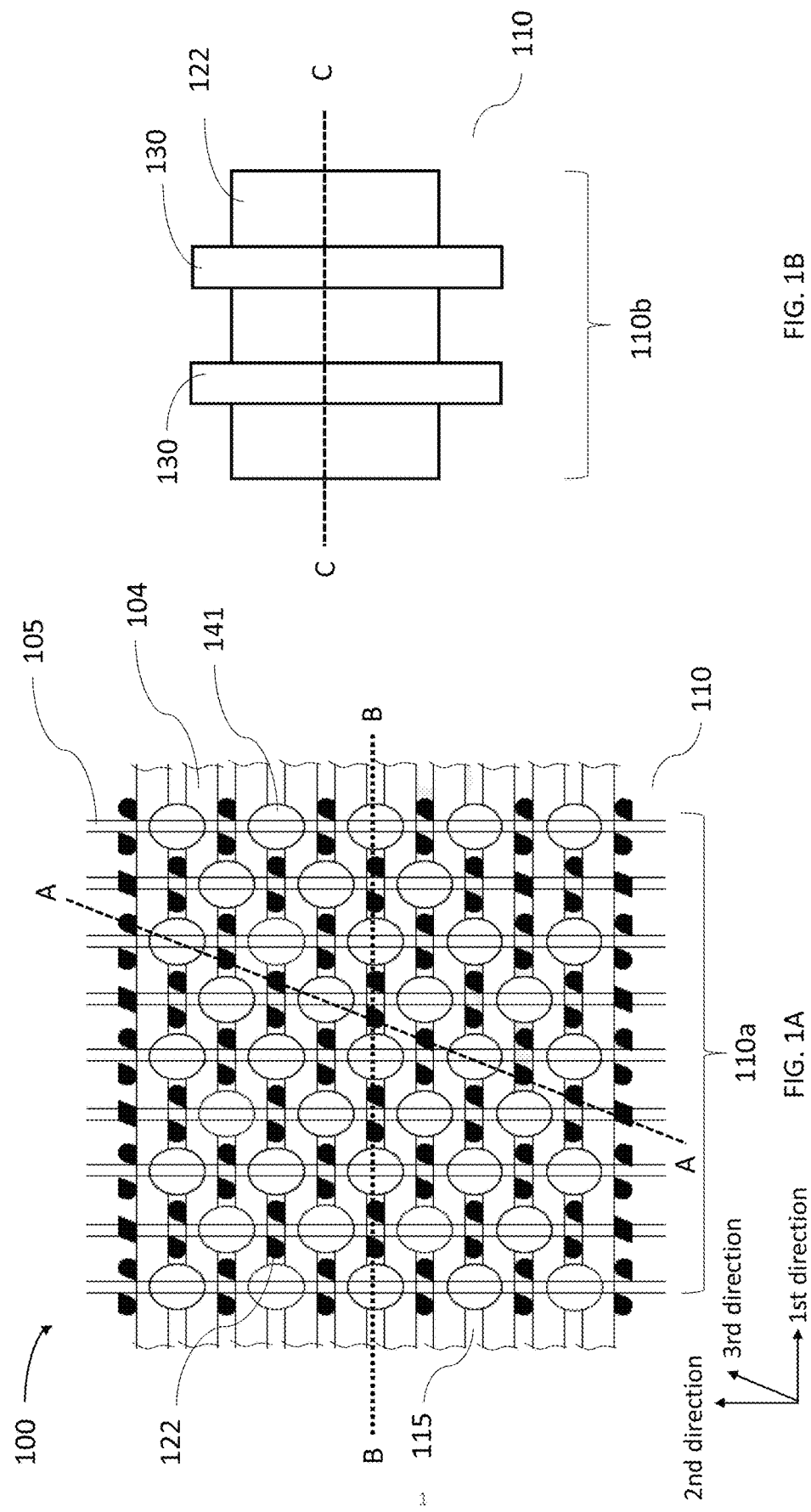

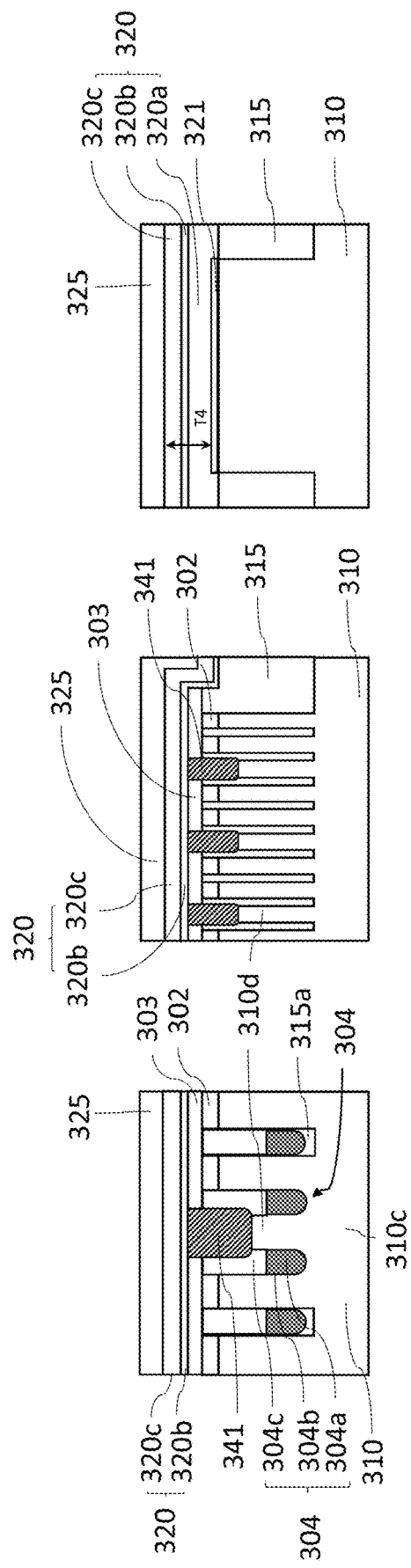

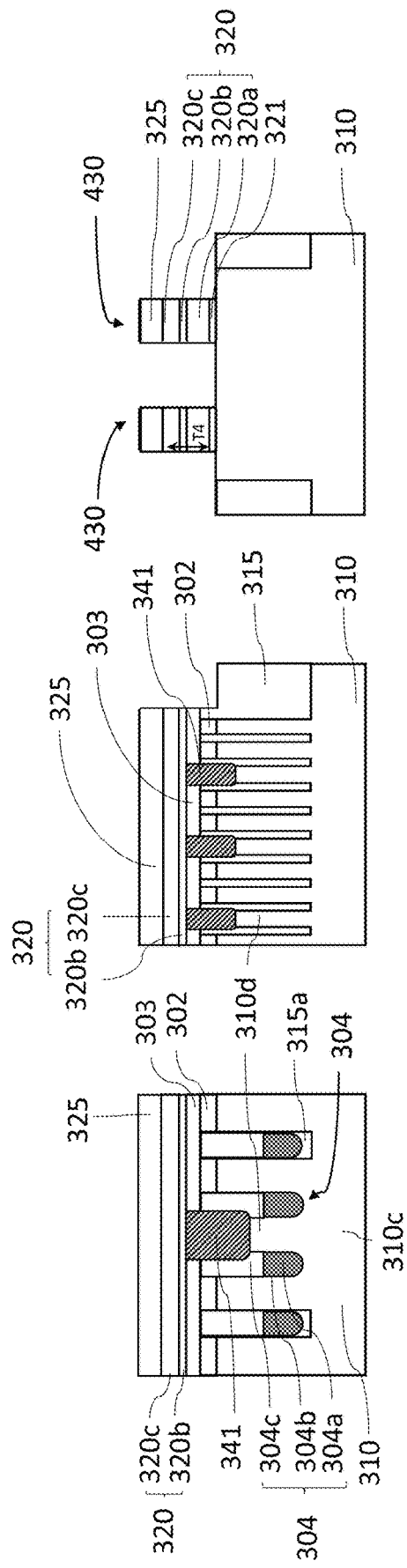

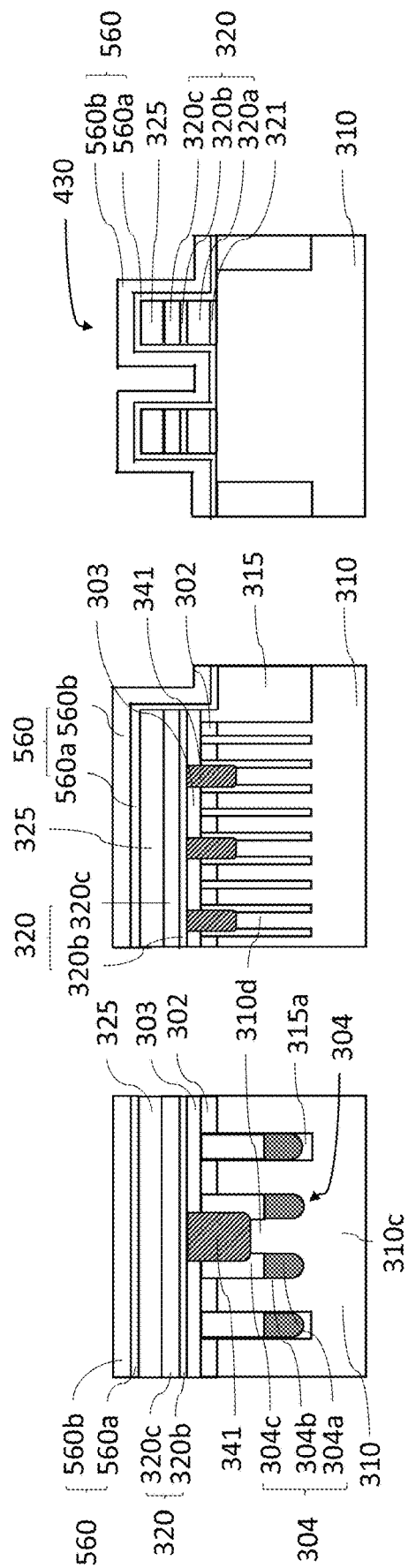

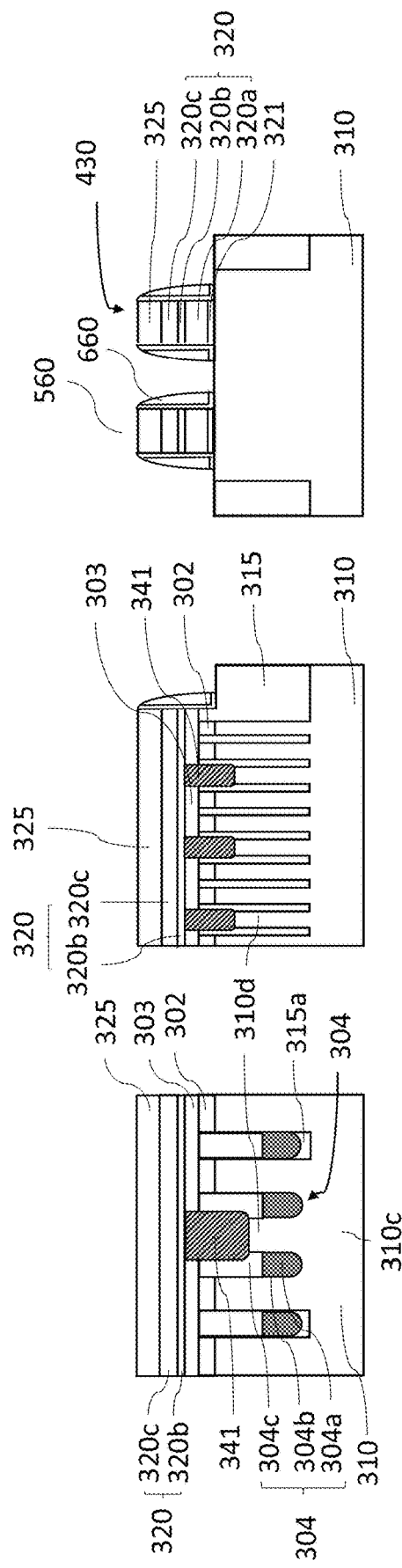

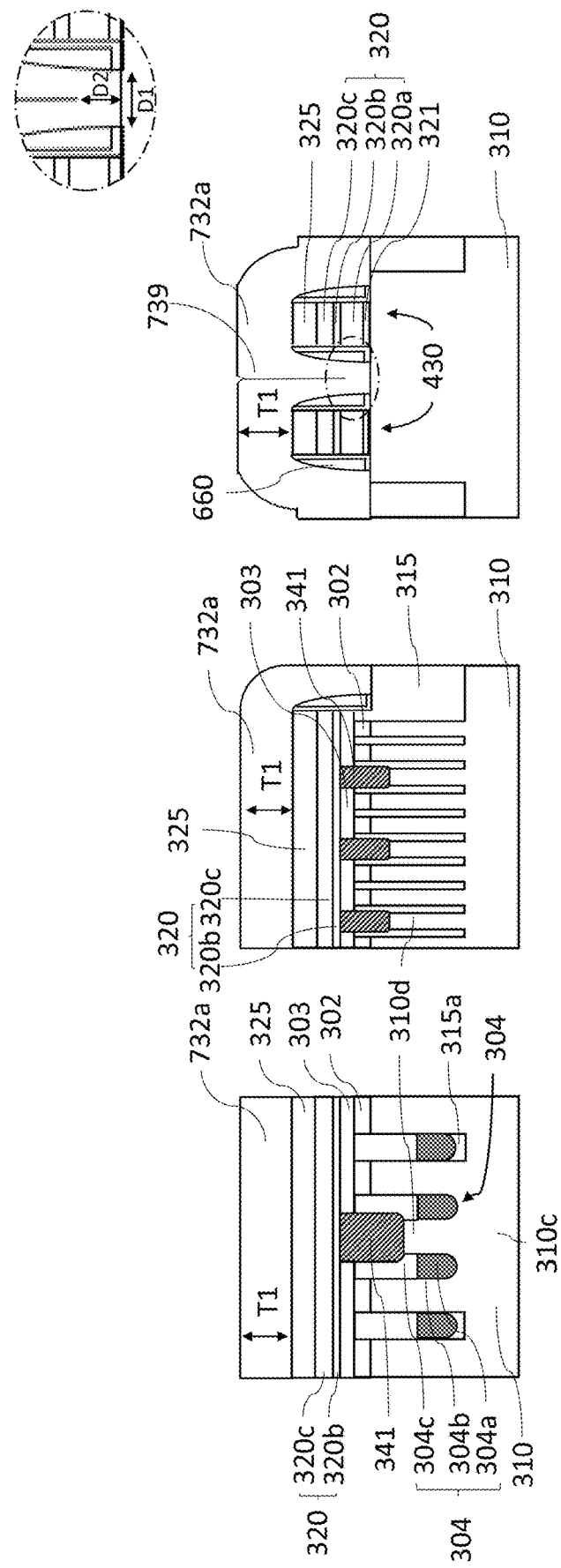

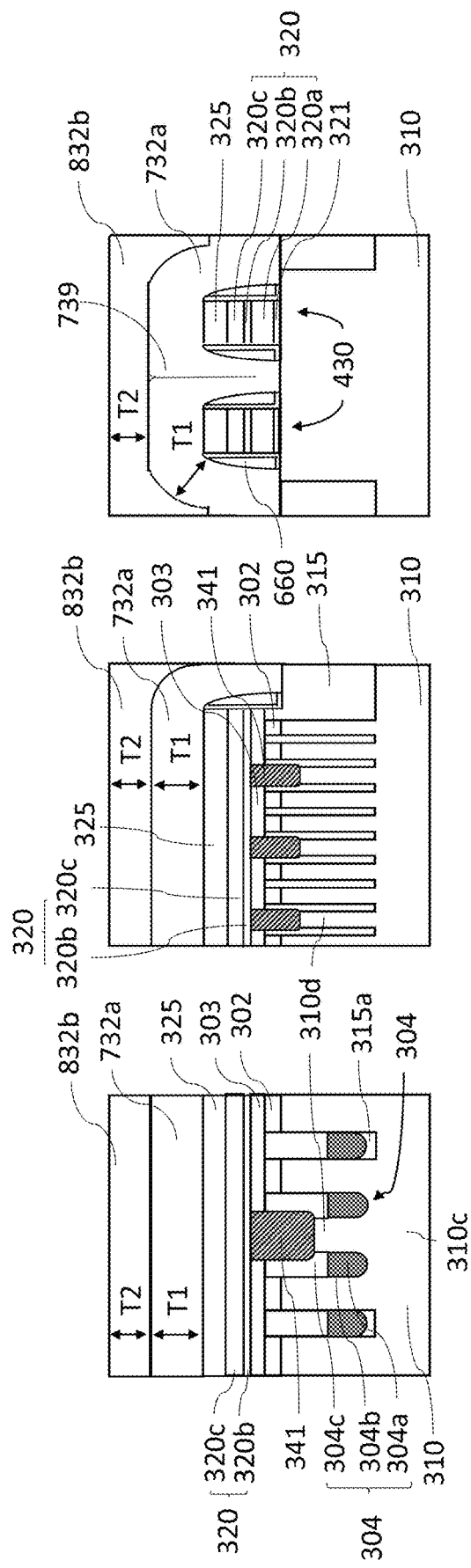

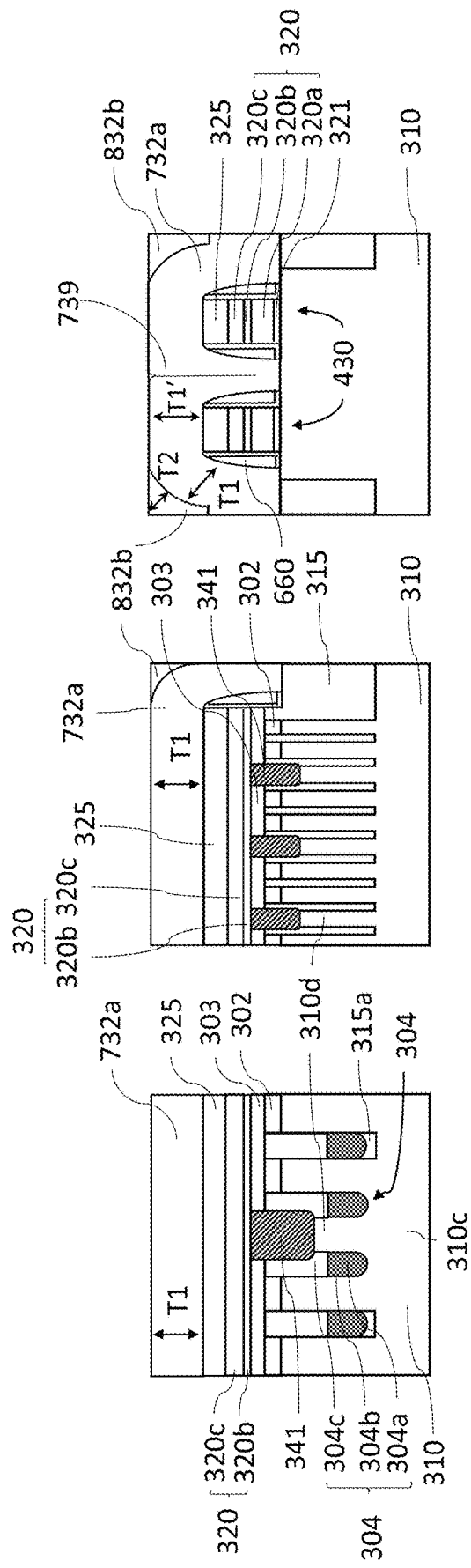

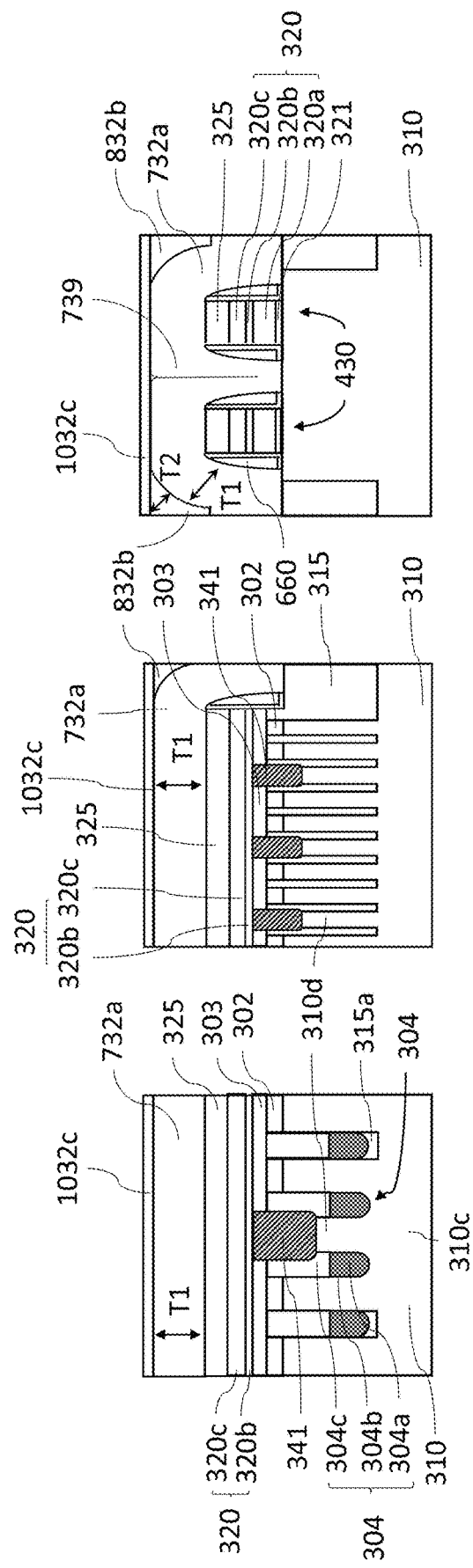

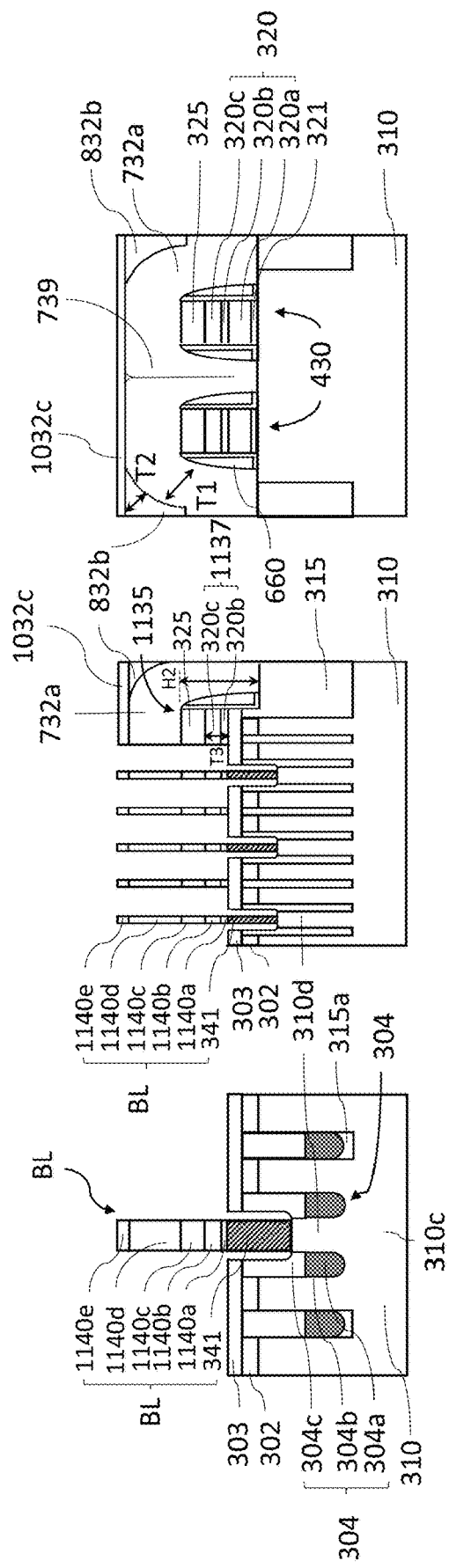

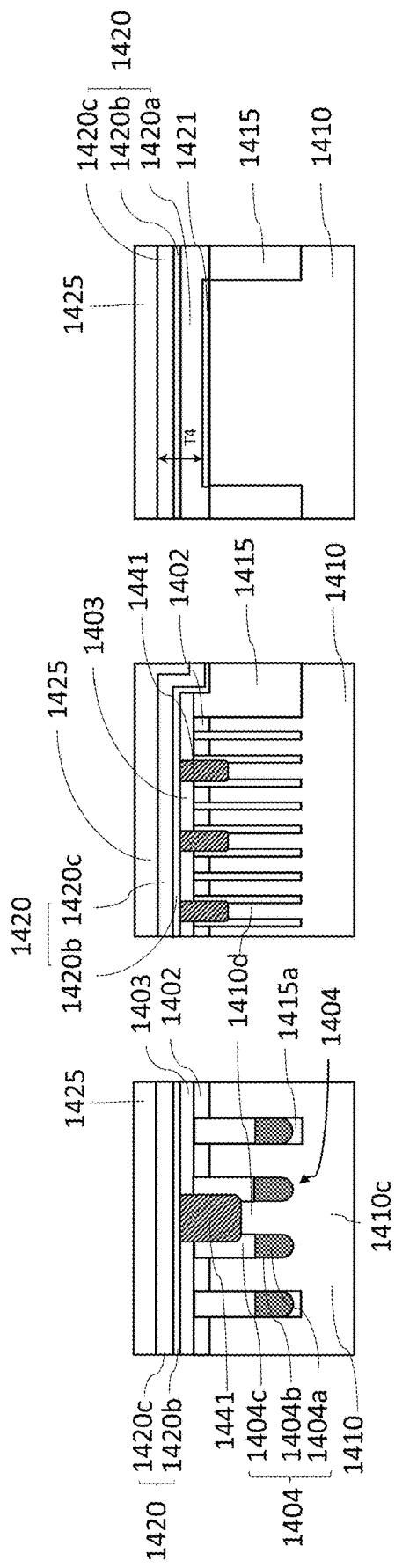

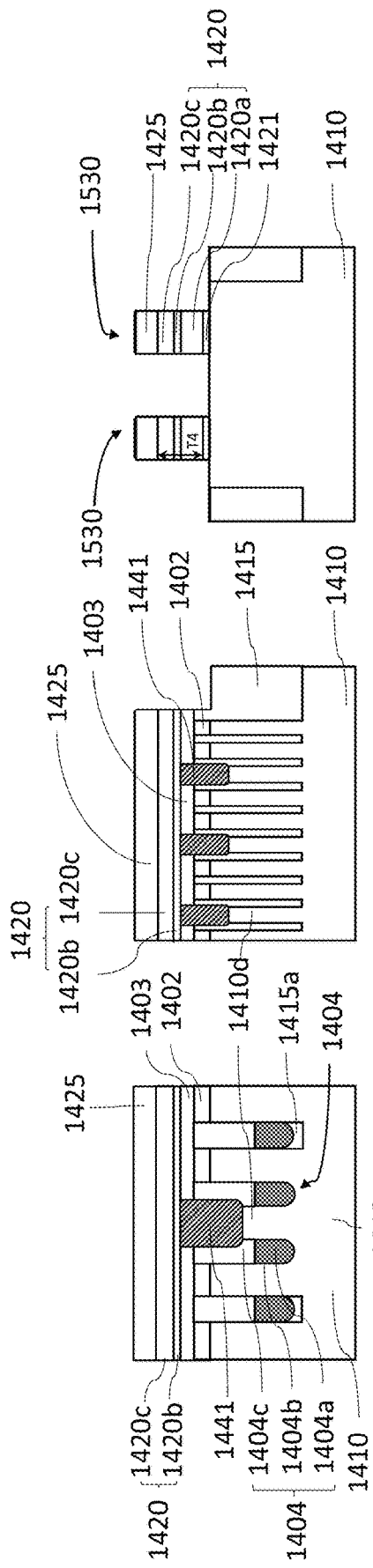

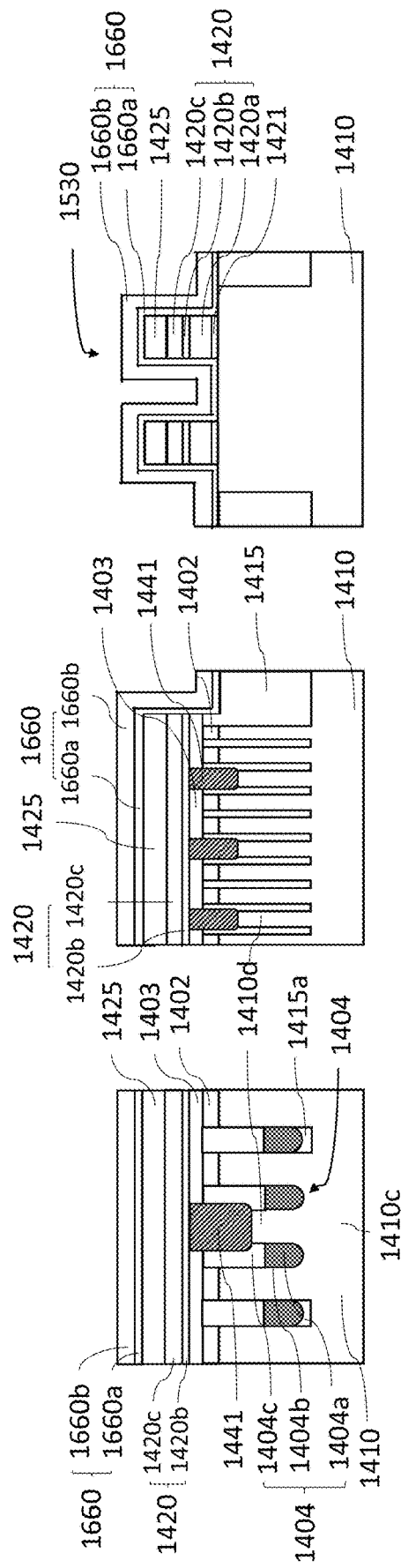

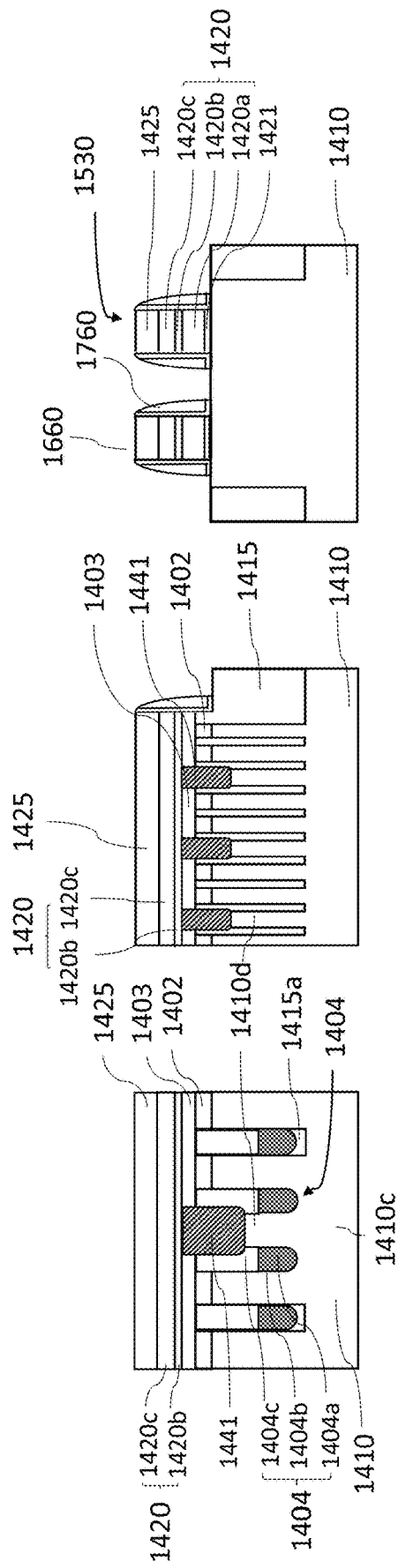

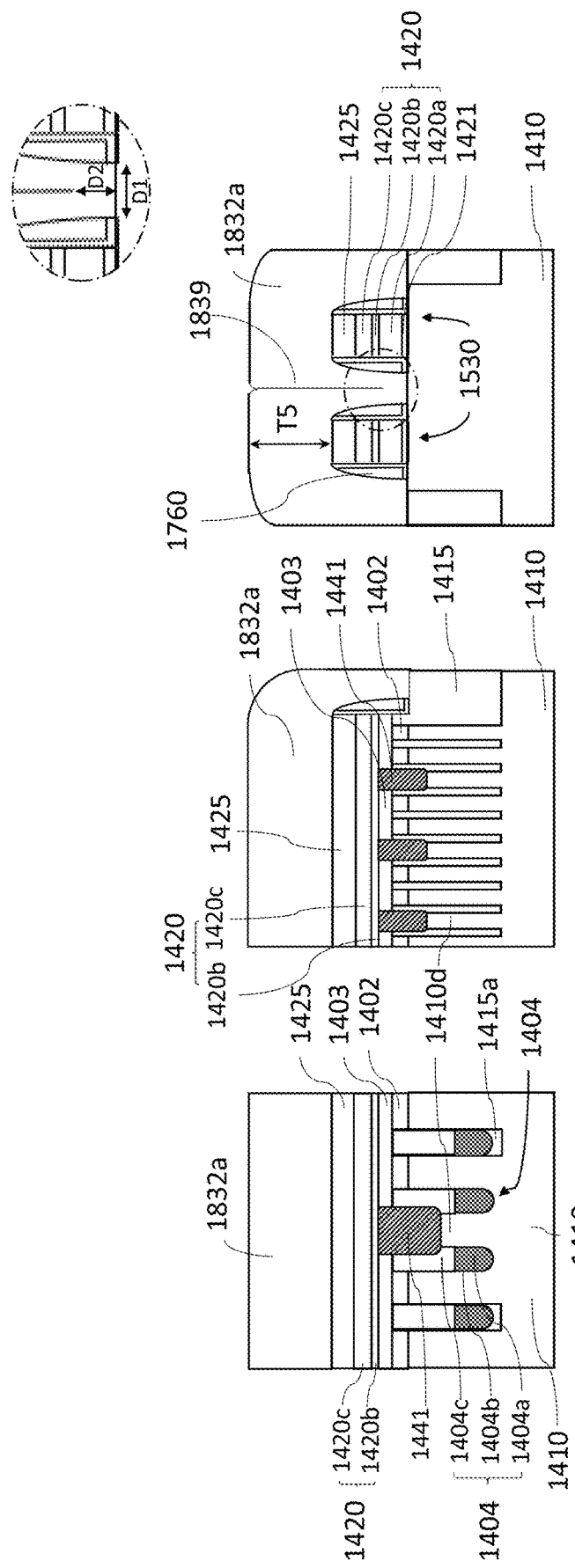

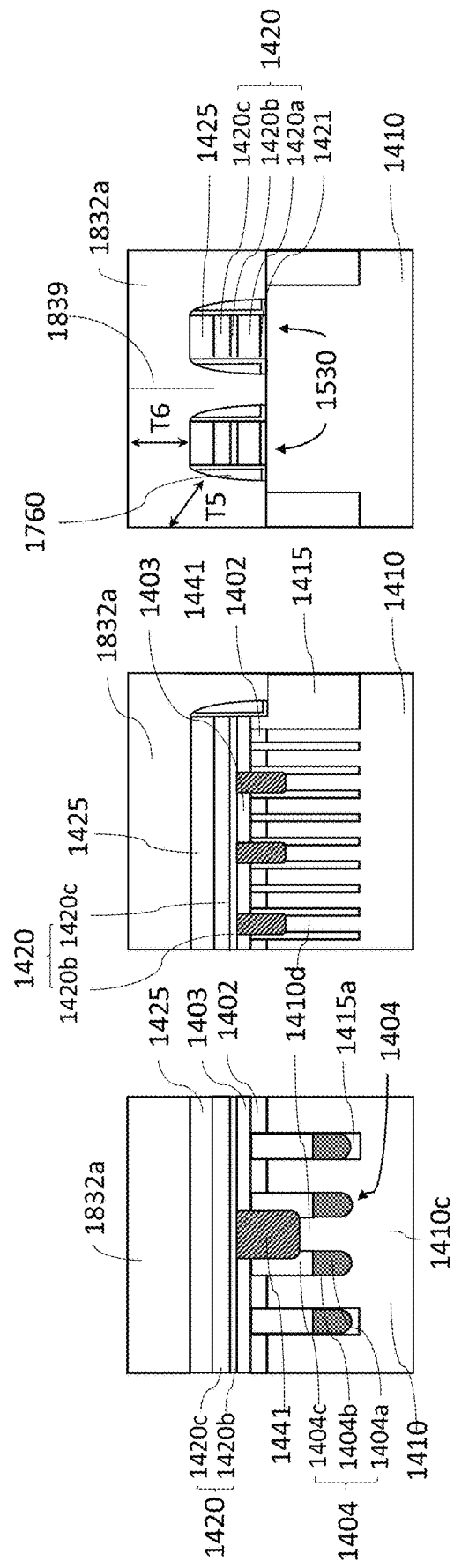

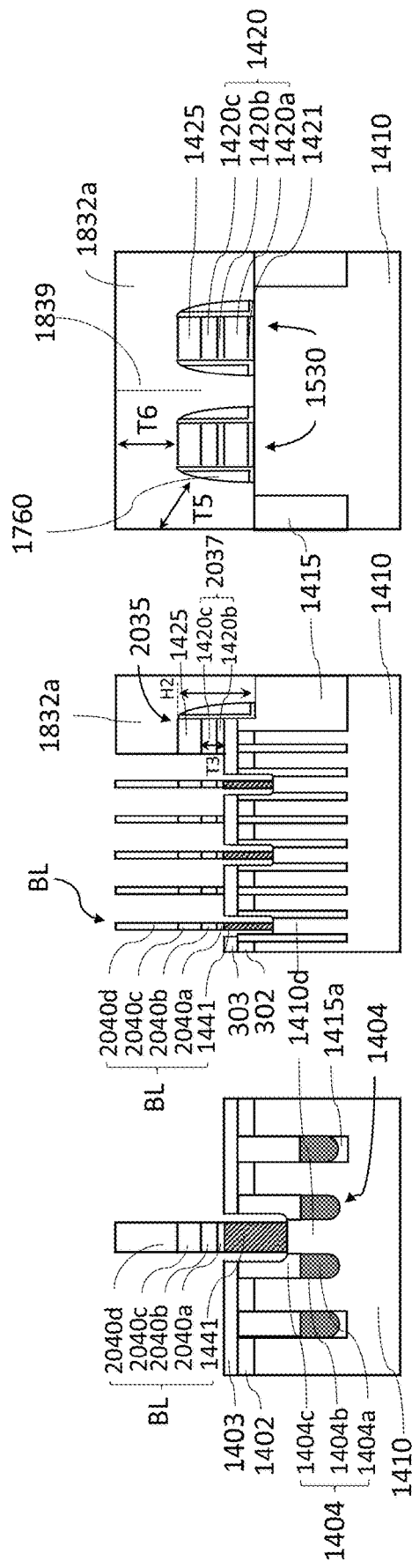

SEMICONDUCTOR DEVICE AND METHOD FOR FABRICATING THE SAME

BACKGROUND

Modern integrated circuits (IC) are designed to encompass millions of components such as transistors, capacitors, resistors with high device density. For example, a semiconductor device such as a DRAM (Dynamic Random Access Memory) includes a cell region and a peripheral region defined on a semiconductor substrate. In the cell region, a plurality of memory cells may be formed with tightly regular arrangement. Each cell may include a cell transistor and a storage capacitor. The peripheral region may include various peripheral circuits for performing operations such as read operation and write operation to the memory cells in the memory cell area.

As integrated circuits (IC) are developed, the desire for higher device density and operation speed becomes never-ending quests for those skilled in the art. With increased device density in the DRAMs, there is a need to miniaturize DRAM device components such as capacitors and transistors. For instance, the capacitors used in DRAMs are formed into a three-dimensional structure with increased vertical surface area, such that a reduction in horizontal dimensions of capacitors can be applied.

BRIEF DESCRIPTION OF THE DRAWINGS

So that the manner in which the recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 1A and 1B illustrate a plane view of cell and peripheral regions of a semiconductor device, respectively, in accordance with some embodiments of the instant disclosure.

FIGS. 3A-3C, 4A-4C, 5A-5C, 6A-6C, 7A-7C, 8A-8C, 9A-9C, 10A-10C, 11A-11C illustrate cross-sectional views of intermediate stages of fabricating the semiconductor device in FIG. 2C in accordance with some embodiments of the instant disclosure.

FIGS. 14A-14C, 15A-15C, 16A-16C, 17A-17C, 18A-18C, 19A-19C, 20A-20C illustrate cross-sectional views of intermediate stages of fabricating the semiconductor device in FIG. 13C in accordance with some embodiments of the instant disclosure.

Figures 2A, 2B:
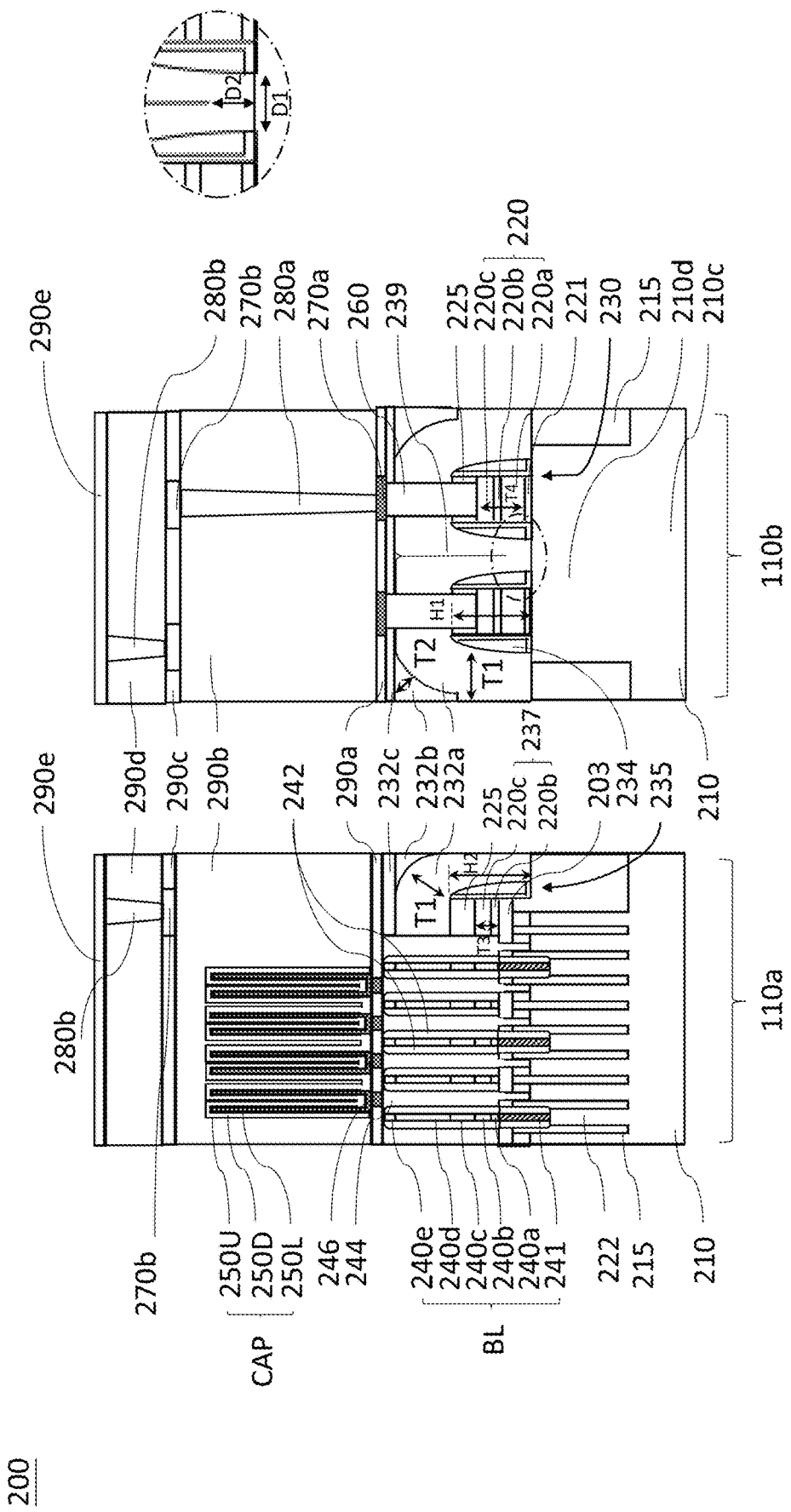
FIGS. 2A and 2B illustrate cross-sectional views of the first embodiment of a semiconductor device in FIGS. 1A and 1B taken along B-B and C-C lines, respectively, in accordance with some embodiments of the instant disclosure.

It is to be noted, however, that the appended drawings illustrate only exemplary embodiments of this disclosure and are therefore not to be considered limiting of its scope, for the disclosure may admit to other equally effective embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the exemplary embodiments in conjunction with the accompanying drawings in FIGS. 1 to 21. Reference will be made to the drawing figures to describe the present disclosure in detail, wherein depicted elements are not necessarily shown to scale and wherein like or similar elements are designated by same or similar reference numeral through the several views and same or similar terminology.

FIGS. 1A and 1B illustrate a plane view of cell and peripheral regions of a semiconductor device 100, respectively, in accordance with some embodiments of the instant disclosure. As illustrated in FIGS. 1A and 1B, the semiconductor device 100 includes a cell region 110a and a peripheral region 110b defined over a substrate 110. The semiconductor device 100 may be a Dynamic Random Access Memory (DRAM) device or other types of memory device, such static random access memory (SRAM) device. A plurality of active areas 122 are formed over the substrate 110 in the cell region 110a and the peripheral region 110b surrounded by an isolation structure 115.

As illustrated in FIG. 1A, a plurality of word lines 104 are formed in the cell region 110a extending along a first direction. A plurality of bit line contacts 141 are formed over the word lines 104. The bit line contacts 141 are electrically connected to the active areas 122 beneath thereof. A plurality of bit lines 105 are formed over the bit line contacts 141 extending in a second direction transverse to the first direction and are substantially parallel with each other. The bit line 105 are electrically connected to the bit line contacts 141 beneath thereof.

As illustrated in FIG. 1B, in the peripheral region 110b, a pair of gate structures 130 are formed in the active area 122 substantially parallel with each other. In certain embodiments, a plurality of peripheral transistors may be formed as functional transistors (e.g., sense amplifier transistors) in the peripheral region 110b.

Figure 2C:
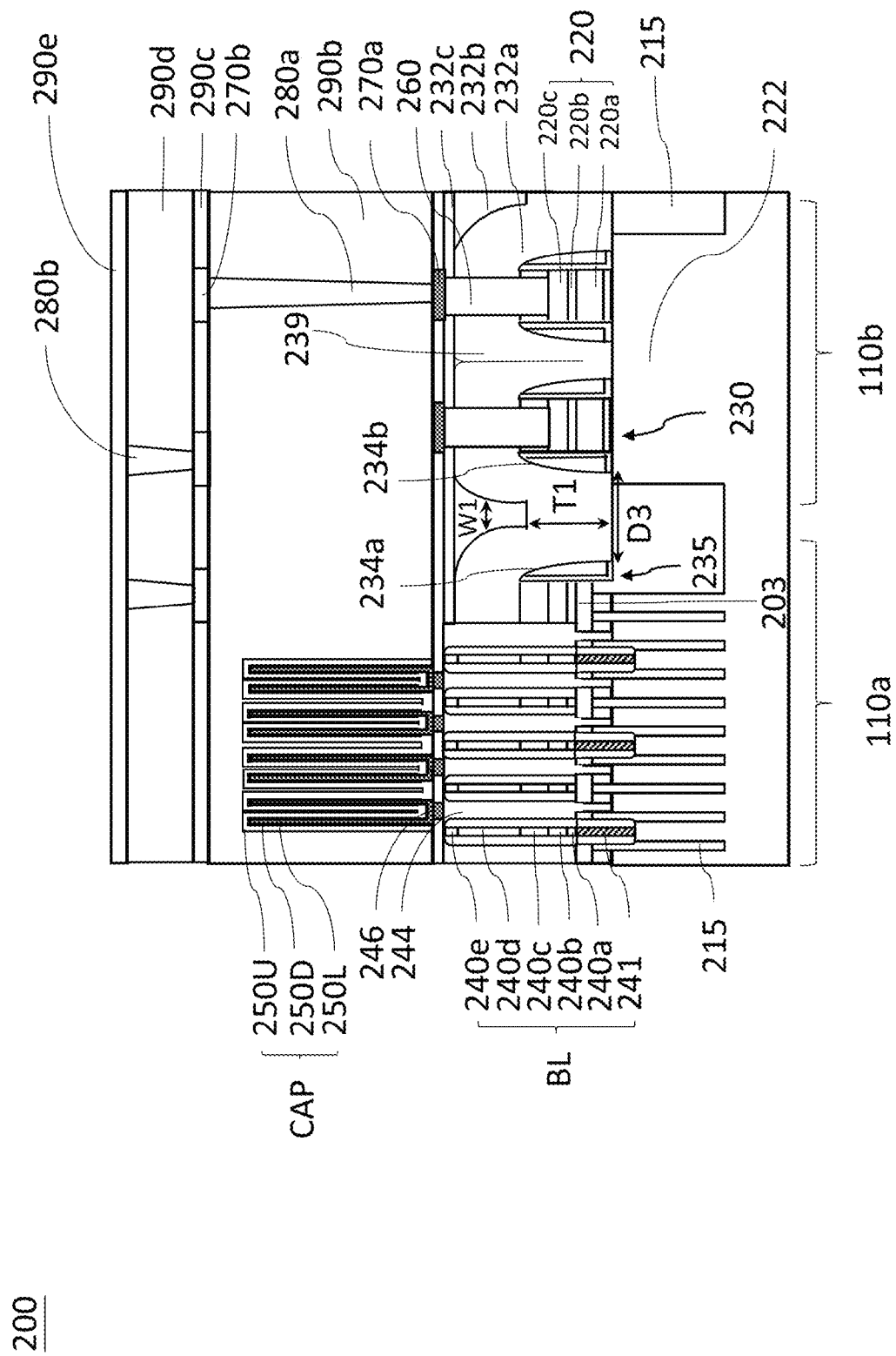
FIG. 2C illustrates a cross-sectional view of the semiconductor device in FIGS. 2A and 2B in accordance with some embodiments of the instant disclosure.

FIGS. 2A and 2B illustrate cross-sectional views of the first embodiment of a semiconductor device in FIGS. 1A and 1B taken along B-B and C-C lines, respectively, in accordance with some embodiments of the instant disclosure. FIG. 2C illustrates a cross-sectional view of the semiconductor device in FIGS. 2A and 2B in accordance with some embodiments of the instant disclosure. As illustrated in FIG. 2A, the semiconductor device 200 comprises a plurality of features formed on the substrate 210. For example, the substrate 210 may comprise a crystalline silicon substrate and various doped regions. The doped regions may be doped with p-type dopant, such as boron or $BF_2$; n-type dopant, such as phosphorus or arsenic; and/or combinations thereof. In some embodiments, the substrate 210 may be made of other suitable elemental semiconductor, such as diamond or germanium; a suitable compound semiconductor material, such as silicon carbide, gallium arsenide, gallium phosphide, indium phosphide, indium arsenide, and indium antimonide; an alloy semiconductor including SiGe, SiGeSn, GaAsP, AlInAs, AlGaAs, GaInAs, GaInP, and GaInAsP; other suitable materials; or combinations thereof. Furthermore, although a bulk substrate is utilized in the instant illustrative example, in some embodiments, the substrate may include an epitaxial layer (epi-layer) and/or may include a silicon-on-insulator (SOI) structure, such as a silicon-on-insulator (SOI) structure, SiGe-on insulator (SiGeOI), Ge on insulator (GeOI) and the like.

An isolation structure 215 in the cell region 110a surrounds a top portion (e.g., active area 222) of the substrate 210. In some embodiments, the isolation structure 215 may be formed by STI (shallow trench isolation) method. A plurality of bit line stacks BL are electrically connected to the active area 222. The bit line stacks BL are transverse to word lines 104. Although not shown in FIG. 2A, the word lines 104 such as buried channel array transistor (BCAT) may be formed in the substrate 210. The type of transistor is not limited thereto. For instance, the transistor may be a planar transistor, a recessed channel array transistor (RCAT), or a sphere-shaped recess channel array transistor (SRCAT). A word line may act as a gate of, e.g., a select transistor.

As illustrated in FIG. 2A, each of the bit line stacks BL comprises the bit line contact 241, a first bit line conductor 240a, a second bit line conductor 240b, a bit line capping 240c, a first bit line dielectric 240d, and a second bit line dielectric 240e. The first bit line conductor 240a, through the bit line contact 241, is electrically connected to the active area 222 that acts as a source or drain of a transistor (e.g., a BCAT transistor). The bit line contact 241 may be made of conductive material such as poly silicon, metal (e.g., tungsten W), or metal silicide (e.g., nickel silicide NiSi). In some embodiments, the first bit line conductor 240a may be a buffer material (e.g., TiN) that may help improve the adhesion between the second bit line conductor 240b and the bit line contact 241. In other embodiments, the first bit line conductor 240a may include poly silicon, metal (e.g., Tungsten W), metal alloy, or the like. The second bit line conductor 240b may be made of conductive material such as poly silicon, metal (e.g., tungsten W), metal alloy (e.g., WN), or the like. In some embodiments, the first bit line conductor 240a and the second bit line conductor 240b may be made of the same material.

As will be apparent further below, the bit line capping 240c may act as a hard mask to prevent subsequent etching processes (e.g., etching portions of the bit line stack BL) from damaging the bit line stacks BL. Moreover, the bit line capping 240c may be a portion of an isolation component that insulates the bit line stack BL from an adjacent conductor (e.g. storage node contact 244). In addition, the first bit line dielectric 240d, the second bit line dielectric 240e, a etch stop layer 203 and bit line spacers 242 may be another portion of the isolation component. In some embodiments, the bit line capping 240c, the first bit line dielectric 240d, the second bit line dielectric 240e, the etch stop layer 203 and the bit line spacer 242 may be made of the insulating material, such as oxide, nitride, and the like.

A dummy gate feature 235 may share similar partial structural appearance with a gate features 230 but does not have the same electrical function as the gate features 230. As illustrated in FIG. 2A, the dummy gate feature 235 is formed above the top portion of the substrate 210 and the isolation structures 215 and includes a dummy gate electrode 237 and a hard mask 225. The dummy gate electrode 237 includes a barrier metal 220b above the top portion of the substrate 210 and a gate metal 220c above the barrier metal 220b. In some embodiments, the barrier metal 220b has a thickness from about 1 nm to about 90 nm. In some embodiments, the hard mask 225 is above the gate metal 220c. In some embodiments, the hard mask 225 has a thickness from about 10 nm to about 90 nm.

As illustrated in FIG. 2A, the cell region 110a further includes a first dielectric layer 232a, a second dielectric layer 232b, and a third dielectric layer 232c. The first dielectric layer 232a is conformally formed on the gate features 230 and the dummy gate feature 235. That is, the thickness of the first dielectric layer 232a on tops of the gate features 230 and the dummy gate feature 235 is substantially the same as the thickness of the first dielectric layer 232a on sidewalls of the gate features 230 and the dummy gate feature 235. In this embodiment, the first dielectric layer 232a may be made of insulating material, such as silicon nitride or the like. In some embodiments, the thickness (T1) of the first dielectric layer 232a is larger than a thickness (T3) of the dummy gate electrode 237. In some embodiments, the thickness (T1) of first dielectric layer 232a is larger than a thickness of the barrier metal 220b. In some embodiments, the thickness (T1) of the first dielectric layer 232a is larger than a thickness of the gate metal 220c. In some embodiments, the thickness (T1) of the first dielectric layer 232a is larger than a thickness of the hard mask 225. In some embodiments, the thickness (T1) of first dielectric layer 232a is from about 80 nm to about 100 nm.

In some embodiments, a thickness (e.g., average thickness T1) of the first dielectric layer 232a is equal to or greater than the height (H2) of the dummy gate feature 235. In such an embodiment, a ratio of the thickness of the first dielectric layer 232a to the height (H2) of the dummy gate feature 235 is from about 1 to about 2. In some embodiments, the thickness (T1) of the first dielectric layer 232a is larger than a thickness of the first bit line conductor 240a. In some embodiments, the thickness (T1) of the first dielectric layer 232a is larger than a thickness of the second bit line conductor 240b. In some embodiments, the first dielectric layer 232a has a larger thickness than at least one of the first 240a and second 240b conductors. In some embodiments, the thickness (T1) of the first dielectric layer 232a is larger than a thickness of the bit line capping 240c.

In this embodiment, the second dielectric layer 232b comprises different insulating material than the first dielectric layer 232a. For example, the second dielectric layer 232b has a smaller dielectric constant than the first dielectric layer 232a. For example, the second dielectric layer 232b may be silicon oxide. In some embodiments, a thickness of the second dielectric layer 232b is smaller than the thickness (T1) of the first dielectric layer 232a. In some embodiments, a top of the dummy gate feature 235 is free of the second dielectric layer 232b.

In this embodiment, the third dielectric layer 232c is made of different insulating material than the second dielectric layer 232b and the same insulating material as the first dielectric layer 232a. The third dielectric layer 232c may be in contact with the first dielectric layer 232a and the second dielectric layer 232b. In some embodiments, the third dielectric layer 232c has a smaller thickness than the first dielectric layer 232a.

Storage elements, e.g., storage capacitors CAP, are formed over a landing pad 246 in a interlayer dielectric (ILD) layer 290b, e.g., a second interlayer dielectric (ILD) layer. The landing pad 246, through the storage node contact 244, is electrically connected to the active area 222 that serve as a source or drain of a transistor (e.g., a BCAT transistor). The landing pad 246 and storage node contact 244 may be made of metal or non-metal conductive material, such as poly-silicon, epitaxial silicon, tungsten, aluminum, nickel, and the like. In some embodiments, the landing pad 246 and the storage node contact 244 may be formed using the same fabrication process and at the same time. A first interlayer dielectric (ILD) layer 290a may surround the landing pad 246 and serve as an etch stop layer during the fabrication of the storage capacitors CAP The first ILD layer 290a may be made of an insulating material, such as silicon oxide, silicon nitride, and the like.

As illustrated in FIG. 2A, the storage capacitors CAP may be arranged over the substrate 210 in the cell region 110a. In some embodiments, the second ILD layer 290b is above the first ILD layer 290a and embeds the storage capacitors CAP. Each of the storage capacitors CAP may comprise a lower electrode 250L, a upper electrode 250U, and a capacitor dielectric 250D arranged between the upper and the lower electrodes 250U, 250L. The lower electrode 250L is electrically connected to the landing pad 246.

In some embodiments, the lower electrode 250L may have a generally cylindrical conductive structure having a high aspect ratio (i.e., high depth to width ratio) and has a U-shaped cross-sectional profile. The lower electrode 250L may be formed from a conformal conductive film made of one or more conductive materials such as poly-silicon, SiGe, BSRO ((Ba,Sr)RuO$_3$), CRO (CaRuO$_3$), LSCo ((La,Sr)CoO$_3$), TiN, TiAlN, TaN, TaAlN, W, WN, Ru, RuO$_2$, SrRuO$_3$, Ir, IrO$_2$, Pt, PtO, SRO (SrRuO$_3$), and the like.

The capacitor dielectric 250D is a conformally formed layer that comprises nitride, oxide, metal oxide, or a combination thereof. For example, the capacitor dielectric 250D may include a single or a multilayered film formed from silicon nitride, silicon oxide, a metal oxide (e.g., HfO$_2$, ZrO$_2$, Al$_2$O$_3$, La$_2$O$_3$, Ta$_2$O$_3$, and TiO$_2$), a perovskite dielectric material (e.g., STO (SrTiO$_3$), BST ((Ba,Sr)TiO$_3$), BaTiO$_3$, PZT, and PLZT, or a combination thereof.

The upper electrode 250U may comprise one or more conductive material such as doped semiconductor, conductive metal nitride, metal, metal silicide, conductive oxide, or a combination thereof. For instance, the upper electrode 250U may comprise conducive material(s) including BSRO ((Ba,Sr)RuO$_3$), CRO (CaRuO$_3$), LSCo ((La,Sr)CoO$_3$), TiN, TiAlN, TaN, TaAlN, W, WN, Ru, RuO$_2$, SrRuO$_3$, Ir, IrO$_2$, Pt, PtO, SRO (SrRuO$_3$), and the like.

Additional wiring and conductive features, such as second via 280b and a second metal line 270b may be formed in additional interlayer dielectric layers, e.g., interlayer dielectric (ILD) layers 290c, 290d, over the substrate 210 to enable interconnection between circuit elements. The second via 280b is in the fourth ILD layer 290d and is electrically connected to a second metal line 270b that is in a third ILD layer 290c. The second metal line 270b may provide horizonal electrically interconnect between via to via. In some embodiments, the via and the metal line may be made of conductive material such as tungsten, aluminum, copper and aluminum-copper alloy. The ILD layers may be made of silicon oxide, silicon nitride, and low k material. In some embodiments, a portion of the ILD layers may be removed to form voids therein. The voids (e.g., air gaps) may reduce the k value (dielectric constant) of the ILD layers.

In some embodiments, an adhesion layer (not shown) may be formed between the interlayer dielectric layer and via or metal line. The adhesion layer may be made of metal or a combination of one or more metals with non-metallic elements such as TiN, Ta, TaN, Cu, CuMn, Co, Ni, Ag, Au, Pt, W among others and facilitates the adhesion properties between different materials. In some embodiments, the adhesion layer may be acted as seed layer to help the metal (e.g., Cu) to grow bigger metal grain size. The bigger metal grain size may help to improve the electromigration effects.

In order to protect the semiconductor device 200 from external physical or chemical damage, a passivation layer 290e may be disposed over the top via (e.g., the second via 280b). The passivation layer 290e may be made of insulating material, such as silicon oxide and silicon nitride.

Functional transistors (e.g., a sense amplifier transistor) may be formed in the peripheral region 110b. The functional transistors are support circuits, e.g., read-out, decoder, or amplifier circuits that control operations of memory cells formed in the cell region 110a. Over the active area 222, there may be one or more upper inter device layers, through which a gate contact 260 may be provided to enable vertical signal conduction (e.g., from the gate feature 230) to a higher device layer. The gate contact 260 may be connected to a corresponding first metal line 270a that may be enable to transfer horizontal signal connection.

As illustrated in FIG. 2B, the substrate 210 in the peripheral region 110b includes a bottom portion 210c and a top portion 210d extending from the bottom portion 210c. An isolation structure 215 is over the bottom portion and surrounds the top portion of the substrate 210. In this embodiment, a plurality of gate features 230 are over the top portion of the substrate 210, each of which comprises a gate dielectric 221, a gate electrode 220, and a gate spacer 234. In some embodiments, a height (H1) of gate features 230 may be about 90 nm to about 110 nm. The gate dielectric 221 may be made of insulating material such as silicon oxide, silicon oxynitride, or a metal oxide. The metal oxide may include, for example, hafnium oxide, aluminum oxide, or titanium oxide. High-K dielectric materials may be utilized to complement metal based gate electrodes for enhancing the performance of a field effect transistor.

In some embodiments, the gate electrode 220 comprises a barrier metal 220b disposed between a gate poly 220a and a gate metal 220c. In some embodiments, the thickness (T4) of the gate electrode 220 may be about 10 nm to about 100 nm. The barrier metal 220b may be made of buffer material, such as tungsten nitride (WN), titanium nitride (TiN) or tantalum nitride (TaN). The gate poly 220a may be made of doped polysilicon. The gate metal 220c may be made of conductive material such as tungsten, titanium, tantalum and aluminum. In an embodiment, the barrier metal 220b and the gate metal 220c are not necessary. In such an embodiment, the gate poly 220a may be in direct contact with the gate contact 260. As will be described further below, the barrier metal 220b and first bit line conductor 240a may be formed using the same fabrication process and at the same time. Similarly, the gate metal 220c and second bit line conductor 240b may be formed using the same fabrication process and at the same time.

A pair of gate spacers 234 may be formed on opposite sidewalls of the gate electrode 220, respectively. The gate spacer 234 may include one or more insulating material, such as silicon oxide, silicon nitride, and the like. In some embodiments, the lateral thickness of gate spacer 234 may act as an adjuster of a transistor's device performance. The lateral thickness of gate spacer 234 may effect the channel length between source and drain. In addition, the first dielectric layer 232a, the second dielectric layer 232b, and the third dielectric layer 232c may be a portion of isolation components which prevent or reduce the functional transistors leakage. The first dielectric layer 232a is above the top portion of the substrate 210 and covers the gate features 230. In this embodiment, the first dielectric layer 232a may be made of insulating material, such as silicon nitride or the like. In some embodiments, the first dielectric layer 232a has a larger thickness than a height (H1) of the gate features 230.

In some embodiments, the first dielectric layer 232a has a thickness (T1) larger than a thickness (T4) of the gate electrode 220. In some embodiments, the first dielectric layer 232a has a thickness (T1) larger than a thickness of the gate poly 220a. In some embodiments, the thickness (T1) of the first dielectric layer 232a is larger than a thickness of the barrier metal 220b. In some embodiments, the thickness (T1) of the first dielectric layer 232a is larger than a thickness of the gate metal 220c. In some embodiments, the thickness (T1) of the first dielectric layer 232a is larger than a thickness of the hard mask 225. In some embodiments, the thickness (T1) of the first dielectric layer 232a is from about 80 nm to about 100 nm.

In an embodiment, a distance (D1) between adjacent gate features 230 is less than the thickness (T1) of the first dielectric layer 232a. In such an embodiment, as illustrated FIG. 2B, a seam 239 is formed in the first dielectric layer 232a between the gate features 230. The size of the seam 239 may correspond to the distance (D1) between adjacent gate features 230. For instance, the shorter the distance (D1), the deeper the seam 239. In some embodiments, a bottom of the seam 239 is sandwiched between the gate polys 220a of gate features 230. In some embodiments, a bottom of the seam 239 is sandwiched between the barrier metals 220b of the gate features 230. In some embodiments, a bottom of the seam 239 is sandwiched between the gate metals 220c of the gate features 230. In some embodiments, the bottom of the seam 239 is above the gate features 230. It is noted herein that the seam 239 is free of the second dielectric layer 232b and the third dielectric layer 232c therein.

In an embodiment, as illustrated in FIG. 2B, a distance (D2) between the substrate 210 and the bottom of the seam 239 is smaller than the distance (D1) between the gate features 230. In such an embodiment, the distance (D2) is equal to or less than half the distance (D1). In another embodiment, the distance (D2) between the substrate 210 and the bottom of the seam 239 is larger than the distance (D1) between the gate features 230. In such another embodiment, the distance (D2) is greater than half the distance (D1).

In some embodiments, the seam 239 may not be formed when the gate features 230 are far enough from each other. That is, in such some embodiments, the gate features 230 are free of a seam therebetween.

In this embodiment, the second dielectric layer 232b may be made of different insulating material than the first dielectric layer 232a. For example, the second dielectric layer 232b has a smaller dielectric constant than the first dielectric layer 232a. For example, the second dielectric layer 232b may be silicon oxide. In some embodiments, a thickness (T2) of the second dielectric layer 232b is smaller than the thickness (T1) of the first dielectric layer 232a. In some embodiments, a ratio of the thickness (T2) of the second dielectric layer 232b to the thickness (T1) of the first dielectric layer 232a is about or less than 1. In some embodiments, the thickness (T2) of the second dielectric layer 232b is less than the depth of the seam 239. In other embodiments, the thickness (T2) of the second dielectric layer 232b is larger than the depth of the seam 239.

In some embodiments, tops of the gate features 230 are free of the second dielectric layer 232b. In other embodiments, the gate features 230 are free of the second dielectric layer 232b therebetween.

In this embodiment, the third dielectric layer 232c may be made of different insulating material than the second dielectric 232b and the same insulating material as the first dielectric 232a. The third dielectric 232c covers a top of the seam 239. The third dielectric 232c is in contact with the first dielectric 232a. The third dielectric 232c is in contact with the second dielectric 232b.

Additional wiring and conductive features, such as first via 280a and second metal line 270b may be formed in additional interlayer dielectric layers, e.g., interlayer dielectric (ILD) layers 290b, 290c, over the substrate 210 to enable interconnection between circuit elements. The first via 280a provides vertical electrically interconnect between the first metal line 270a to the second metal line 270b. The second metal line 270b provides horizonal electrically interconnect between via to via. In some embodiments, the via and the metal line may be made of conductive material such as tungsten, aluminum, copper and aluminum-copper alloy.

The interlayer dielectric layers may be made of silicon oxide, silicon nitride, and low k material. In some embodiments, a portion of interlayer dielectric layer may be removed. The voids (e.g., air gaps) may be incorporated between metal dielectric layer to reduce the k value (dielectric constant) of interlayer dielectric layer.

In this embodiment, the first metal line 270a may be electrically connected to the second via 280b through the first via 280a and the second metal line 270b. The second ILD layer 290b surrounds the first via 280a. The third ILD layer 290c surrounds the second metal line 270b to separate the adjacent second metal line 270b. Similarly, The fourth ILD layer 290d surrounds the second via 280b. In some embodiments, additional metal/via structures may be disposed over the second via 280b. The second via 280b may be electrically connected to the additional metal/via structure to transfer signals from the functional transistors.

As illustrated in FIG. 2C, on the boundary of cell region 110a and peripheral region 110b, the first dielectric layer 232a is formed between the dummy gate feature 235 and the gate feature 230. In this embodiment, the first dielectric layer 232a is in contact with the isolation structure 215 and the active area 222. The second dielectric layer 232b is above the first dielectric layer 232a. In this embodiment, the second dielectric layer 232b has a curved sidewall and a substantially flat top and bottom. In some embodiments, the second dielectric layer 232b has a width (W1) is smaller than a distance (D3) between the dummy gate feature 235 and the gate feature 230. In other embodiments, the sidewalls of the second dielectric layer 232b aligns with the gate spacer 234a of the dummy gate feature 235 and the gate spacer 234b of the gate feature 230.

In some embodiments, the bottom of the second dielectric layer 232b is sandwiched between the barrier metal 220b of the gate feature 230 and the barrier metal 220b of the dummy gate feature 235. In some embodiments, the bottom of the second dielectric layer 232b is sandwiched between the gate metal 220c of the gate feature 230 and the gate metal 220c of the dummy gate feature 235. In some embodiments, the bottom of the second dielectric layer 232b is sandwiched between the etch stop layer 203 and the gate poly 220a of the gate feature 230. In some embodiments, a seam may be formed when the gate feature 230 and the dummy gate feature 235 are close enough from each other. It is noted herein that the seam is free of the second dielectric layer 232b and the third dielectric layer 232c therein.

FIGS. 3A-11C illustrate cross-sectional views of intermediate stages of fabricating the semiconductor device 200 in FIG. 2C in accordance with some embodiments of the instant disclosure. FIGS. 3A-11A, 3B-11B, and 3C-11C illustrate cross-sectional views of intermediate stages of fabricating the semiconductor device in FIGS. 1A and 1B taken along A-A, B-B and C-C lines, respectively. As illustrated in FIGS. 3A, 3B, and 3C, a substrate 310 is provided. The substrate 310 includes a bottom portion 310c and a top portion 310d extending from the bottom portion 310c. An isolation structure 315 is over the bottom portion 310c and surrounds the top portion 310d of the substrate 310. Word line structures 304 are at the top portion 310d of substrate 310 and the isolation structure 315a. Each of the word line structures 304 comprises a cell gate conductor 304a, a cell gate dielectric 304b, and a cell gate capping 304c. The cell gate dielectric 304b is arranged between the cell gate conductor 304a and the substrate 310. In some embodiments, the cell gate dielectric 304b includes a thermal oxide, silicon nitride, silicon oxynitride, a high-k dielectric, or a combination thereof. The cell gate conductor 304a may be made of a conductive material such as doped silicon, metal (e.g., tungsten, aluminum, titanium, and/or tantalum), conductive metal nitride (e.g., titanium nitride, tantalum nitride, and/or tungsten nitride) and metal-semiconductor compound (e.g., a metal silicide). The cell gate capping 304c is above the cell gate conductor 304a. In some embodiments, the cell gate capping 304c may be made of insulating material such as silicon oxide and silicon nitride.

An oxide layer 302 is over the top portion 310d of the substrate 310 and surrounds the cell gate cappings 304c. The oxide layer 302 may be made of the insulating material, such as silicon oxide, and the like. A bit line contact 341 is between an adjacent pair of the cell gate cappings 304c. The bit line contact 341 may be made of conductive material such as poly silicon, metal (e.g., tungsten W), or metal silicide (e.g., nickel silicide NiSi).

An etch stop layer 303 surrounds the bit line contact 341 and is over the oxide layer 302 and the cell gate cappings 304c. The etch stop layer 303 may be made of insulating material such as silicon oxide and silicon nitride.

A gate electrode 320 is over the etch stop layer 303, the bit line contact 341, and a gate dielectric 321. The gate electrode 320 may comprise a gate poly 320a, a barrier metal 320b above the gate poly 320a, and a gate metal 320c above the barrier metal 320b. In some embodiments, a thickness (T4) of the gate electrode 320 may be about 10 nm to about 100 nm. The barrier metal 320b may be made of conductive material such as TiN or WN or the like. In some embodiments, the barrier metal 220b has a thickness from about 1 nm to about 90 nm. In other embodiments, the barrier metal 320b may be optional. The gate metal 320c may be made of conductive material such as poly silicon or tungsten. The gate poly 320a may be made of doped polysilicon.

The gate dielectric 321 may be made of insulating material such as silicon oxide, silicon oxynitride, or a metal oxide. The metal oxide may include, for example, hafnium oxide, aluminum oxide, or titanium oxide.

A hard mask 325 is over the gate electrode 320 and act as the etch protect layer, e.g., during etching portions of the gate electrode 320. In some embodiments, the hard mask 225 has a thickness from about 10 nm to about 90 nm.

Next, as illustrated in FIGS. 4A, 4B and 4C, the hard mask 325, the gate electrode 320, and the gate dielectric 321 are etched to form a pair of gate features 430. In this embodiment, each of the gate features 430 includes the gate dielectric 321, the gate poly 320a above the gate dielectric 321, the barrier metal 320b above the gate poly 320a, the gate metal 320c above the barrier metal 320b, and the hard mask 325 above the gate metal 320c. In some embodiments, the hard mask 325, the gate electrode 320, and the gate dielectric 321 are etched using an anisotropic etching process, such as plasma etching and/or reactive ion etching (RIE).

Next, as illustrated in FIGS. 5A, 5B, and 5C, a spacer layer 560 are formed over a top surface of the hard mask 325, on sidewalls of the etch stop layer 303 and the gate electrode 320, and over the gate features 430. The spacer layer 560 may include one or more insulating materials, such as silicon oxide, silicon nitride, and the like. In this embodiment, the spacer layer 560 includes a first spacer layer 560a and a second spacer layer 560b. In some embodiments, the first spacer layer 560a is made of silicon nitride and the second spacer layer 560b is made of silicon oxide.

Next, as illustrated in FIGS. 6A, 6B, and 6C, the spacer layer 560 on the top surface of the hard mask 325 and top surfaces of the gate features 430 are removed, leaving a gate spacer 660 on the sidewalls of the etch stop layer 303 and the gate electrode 320 and sidewalls of the gate features 430. In some embodiments, the gate spacer 660 etching process may use an anisotropic etching process, such as plasma etching and/or reactive ion etching (RIE). In other embodiments, the gate spacer 660 etching processes may be a 2-step process. One is wet etching process, such as HF etching to remove silicon oxide material and the other is dry etching process, such as plasma etching and/or reactive ion etching (RIE) to remove silicon nitride material.

Next, as illustrated in FIGS. 7A, 7B, and 7C, a first dielectric layer 732a is formed over a top surface of the hard mask 325 and on the gate spacer 660. The first dielectric layer 732a is substantially formed conformally on the gate features 430. That is, the thickness (T1) of the first dielectric layer 732a on the top of the gate feature features 430 is substantially the same as the thickness of the first dielectric layer 732a on the sidewall of the gate features 430. In this embodiment, the first dielectric layer 732a may be made of insulating material, such as silicon nitride, or the like. In some embodiments, the thickness (T1) of first dielectric layer 732a may be greater than a thickness of the barrier metal 320b. In some embodiments, the thickness (T1) of first dielectric layer 732a may be greater than a thickness of the gate metal 320c. In some embodiments, the thickness (T1) of first dielectric layer 732a may be greater than a thickness of the hard mask 325. In some embodiments, the thickness (T1) of first dielectric layer 732a may be from about 80 nm to about 100 nm.

In an embodiment, a distance (D1) between the gate features 430 is less than the thickness (T1) of the first dielectric layer 732a. In such an embodiment, a seam 739 is formed in the first dielectric layer 732a between the gate features 430. The size of the seam 739 may be effected by the distance between adjacent gate features 430. For instance, the shorter the distance (D1), the deeper the seam 739. In some embodiments, a bottom of the seam 739 is sandwiched between the gate polys 320a of gate features 430. In some embodiments, a bottom of the seam 739 is sandwiched between the barrier metals 320b of the gate features 430. In some embodiments, a bottom of the seam 739 is sandwiched between the gate metals 320c of the gate features 430. In some embodiments, the bottom of the seam 739 is above the gate features 430.

In an embodiment, a distance (D2) between the substrate 310 and the bottom of the seam 739 is smaller than the distance (D1) between the gate features 430. In such an embodiment, the distance (D2) is equal to or less than half the distance (D1). In another embodiment, a distance (D2) between the substrate 310 and the bottom of the seam 739 is larger than the distance (D1) between the gate features 430. In such another embodiment, the distance (D2) is greater than half the distance (D1).

In some embodiments, the seam 739 may not be formed when the gate features 430 are far enough from each other. That is, the gate features 430 are free of a seam 739 therebetween.

Next, as illustrated in FIGS. 8A, 8B, and 8C, a second dielectric layer 832b is formed over a top surface of the first dielectric layer 732a. The second dielectric layer 832b may be made of different insulating material than the first dielectric layer 732a. For example, the second dielectric layer 832b has a smaller dielectric constant than the first dielectric layer 732a. For example, the second dielectric layer 832b may be silicon oxide. A thickness (T2) of the second dielectric layer 832b is smaller than the thickness (T1) of the first dielectric layer 732a. In some embodiments, a ratio of the thickness (T2) of the second dielectric layer 832b to a thickness (T1) of the first dielectric layer 732a is from about 0 to about 1. In some embodiments, the thickness (T2) of the second dielectric layer 832b is less than the depth of the seam 739. In other embodiments, the thickness (T2) of the second dielectric layer 832b is greater than the depth of the seam 739. In some embodiments, tops of the gate features 430 are free of the second dielectric layer 832b. In other embodiments, the gate features 430 are free of the second dielectric layer 832b therebetween. In some embodiments, the second dielectric layer 832b is formed by a spin-on dielectric (SOD) method to have good gap filled properties.

Next, as illustrated in FIGS. 9A, 9B, and 9C, a planarization process is performed to expose the top surface of the first dielectric layer 732a. Is some embodiments, the planarization process may be chemical-mechanical polishing (CMP). In some embodiments, a top portion of the first dielectric layer 732a may be removed by the planarization process. That is, the thickness (T1') of the first dielectric layer 732a on the tops of the gate features 430 is slightly smaller than the thickness (T1) of the first dielectric layer 732a on the sidewall of gate features 430.

Next, as illustrated in FIGS. 10A, 10B, and 10C, a third dielectric layer 1032c is formed over a top surface of the first dielectric layer 732a and the second dielectric layer 832b. In some embodiments, the third dielectric layer 1032c may be made of different insulating material than the second dielectric layer 832b and the same insulating material as the first dielectric layer 732a. The third dielectric layer 1032c may be in contact with the first dielectric layer 732a and second dielectric layer 832b.

Next, as illustrated in FIGS. 11A, 11B, and 11C, portions of bit line contact 341, the etch stop layer 303, the barrier metal 320b, the gate metal 320c, the hard mask 325, the first dielectric layer 732a, and the third dielectric layer 1032c are etched to form a dummy gate feature 1135. The dummy gate feature 1135 may have a structure similar to a structure of the gate features 430. The dummy gate feature 1135 is formed above the top portions of the substrate 310 and the isolation structures 315 and includes a dummy gate electrode 1137 and the hard mask 325. The dummy gate electrode 1137 includes the barrier metal 320b and the gate metal 320c. In some embodiments, the thickness (T1) of the first dielectric layer 732a is larger than the thickness of (T3) dummy gate electrode 1137. The first dielectric layer 732a is substantially formed conformally on the gate features 430 and the dummy gate feature 1135. That is, the thickness of the first dielectric layer 732a on the top of the gate features 430 and the dummy gate feature 1135 is substantially the same as the thickness of the first dielectric layer 732a on sidewalls of the gate features 430 and the dummy gate feature 1135. In some embodiments, the thickness (T1) of the first dielectric layer 732a is equal to or greater than the height (H2) of the dummy gate feature 1137. In such an embodiment, a ratio of the thickness (T1) of the first dielectric layer 732a to the height (H2) of the dummy gate feature 1135 is from about 1 to about 2.

A plurality of bit line stacks BL are formed over the top portion 310d of the substrate 310. Each of the bit line stacks BL comprises the bit line contact 341, a first bit line conductor 1140a, a second bit line conductor 1140b, a bit line capping 1140c, a first bit line dielectric 1140d, and a second bit line dielectric 1140e. In some embodiments, the thickness (T1) of the first dielectric layer 732a is larger than a thickness of the first bit line conductor 1140a. In some embodiments, the thickness (T1) of the first dielectric layer 732a is larger than a thickness of the second bit line conductor 1140b. In some embodiments, the thickness (T1) of the first dielectric layer 732a is larger than a thickness of the bit line capping 1140c. In some embodiments, the first dielectric layer 732a has a substantially the same thickness (T1) as a bit line dielectric 1140d of the bit line stack BL.

Additional wiring and conductive features, such as second via 280b and a second metal line 270b are formed in additional interlayer dielectric layers, e.g., interlayer dielectric (ILD) layers 290c, 290d, over the substrate 310 to enable interconnection between circuit elements. For example, the first ILD layer 290a is deposited over the cell region 110a and the peripheral region 110b. The first metal line 270a and the landing pad 246 are formed in the first ILD layer 290a. The second ILD layer 290b is deposited over the first ILD layer 290a. The storage capacitors CAP and the first via 280a are formed in the second ILD layer 290b. The third ILD layer 290c is deposited over the second ILD layer 290b. The metal line 270b is formed in the third ILD layer 290c. The fourth ILD layer 290d is deposited over third ILD layer 290c. The second via 280b is formed in the fourth ILD layer 290d. The passivation layer 290e is deposited over the fourth ILD layer 290d.

Figure 12:
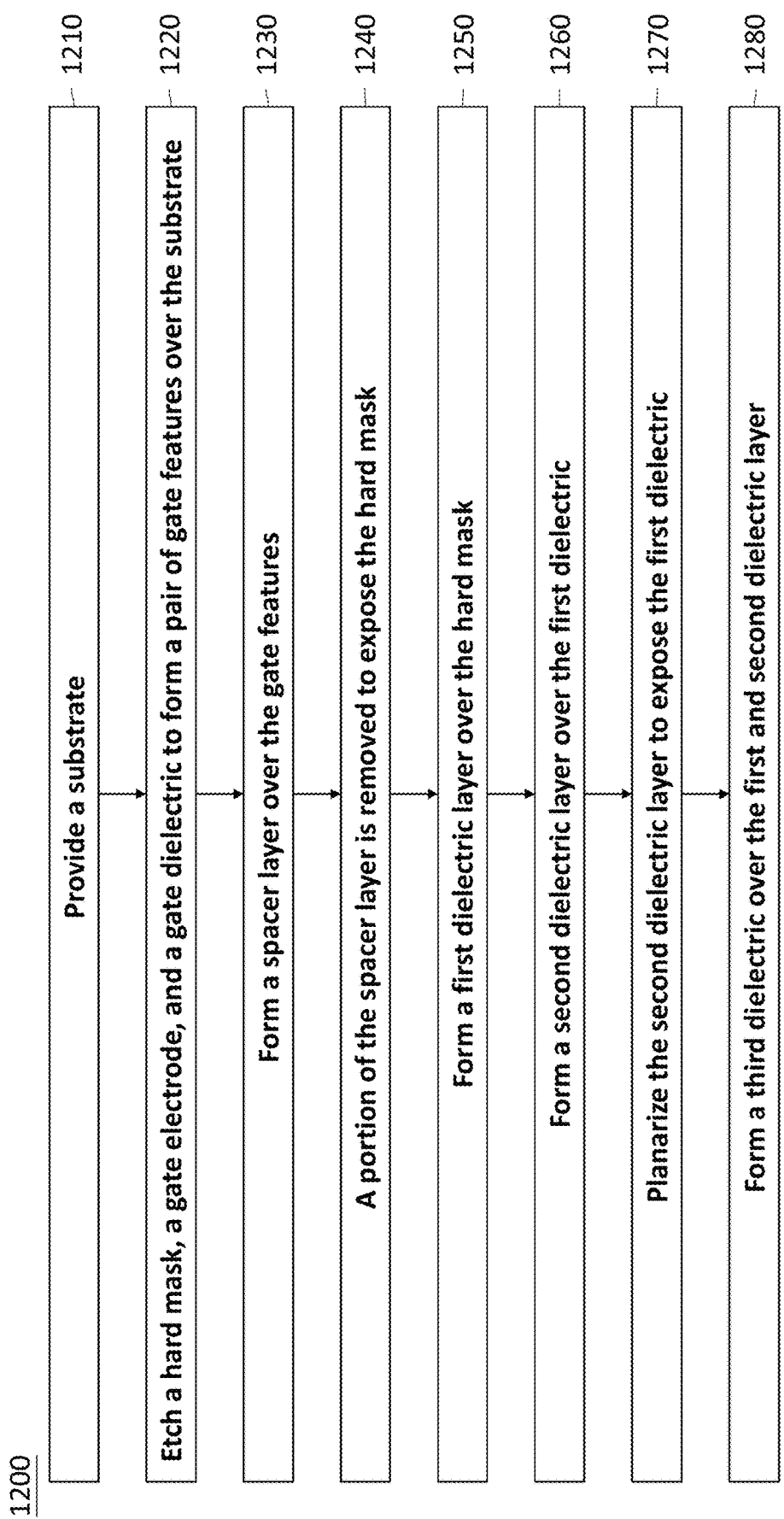
FIG. 12 illustrates a flowchart of the first embodiment of a method for fabricating a semiconductor device according to some embodiments of the instant disclosure.

FIG. 12 illustrates a flowchart of the first embodiment of a method 1200 for fabricating the semiconductor device 200 according to some embodiments of the instant disclosure. As illustrated in FIG. 12, in block 1210, a substrate is provided. Next, in block 1220, a hard mask, a gate electrode, and a gate dielectric are etched to form a pair of gate features over the substrate. Next, in block 1230, a spacer layer is formed over the gate features. Next, in block 1240, a portion of the spacer layer is removed to expose the hard mask. Next, in block 1250, a first dielectric layer is formed over the hard mask. Next, in block 1260, a second dielectric layer is formed over the first dielectric layer. Next, in block 1270, the second dielectric layer is planarized to expose the first dielectric layer. Next, in block 1280, a third dielectric layer is formed over the first and second dielectric layers.

Figures 13A, 13B:
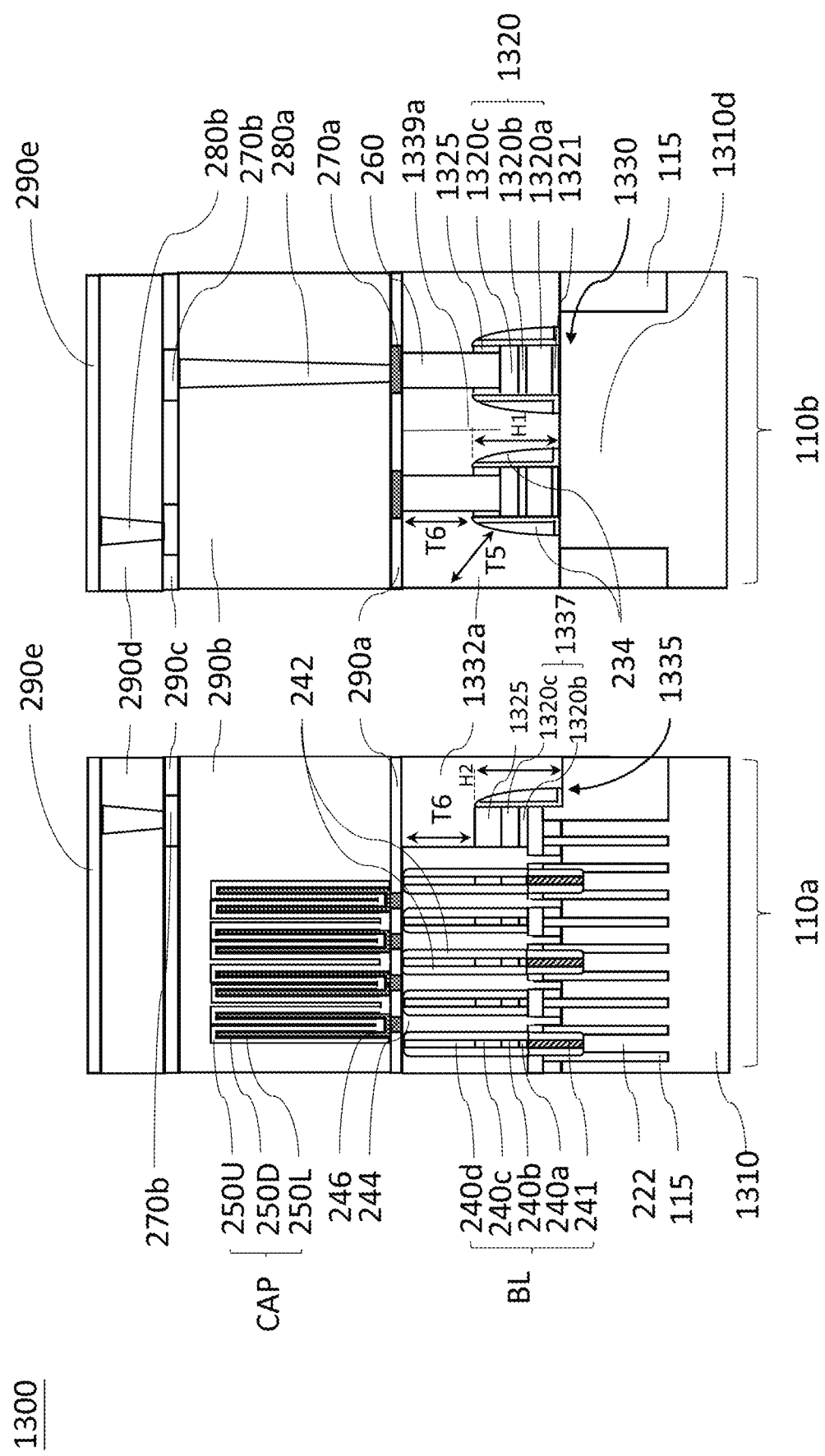
FIGS. 13A and 13B illustrate cross-sectional views of the second embodiment of a semiconductor device in FIGS. 1A and 1B taken along B-B and C-C lines, respectively, in accordance with some embodiments of the instant disclosure.
Figure 13C:
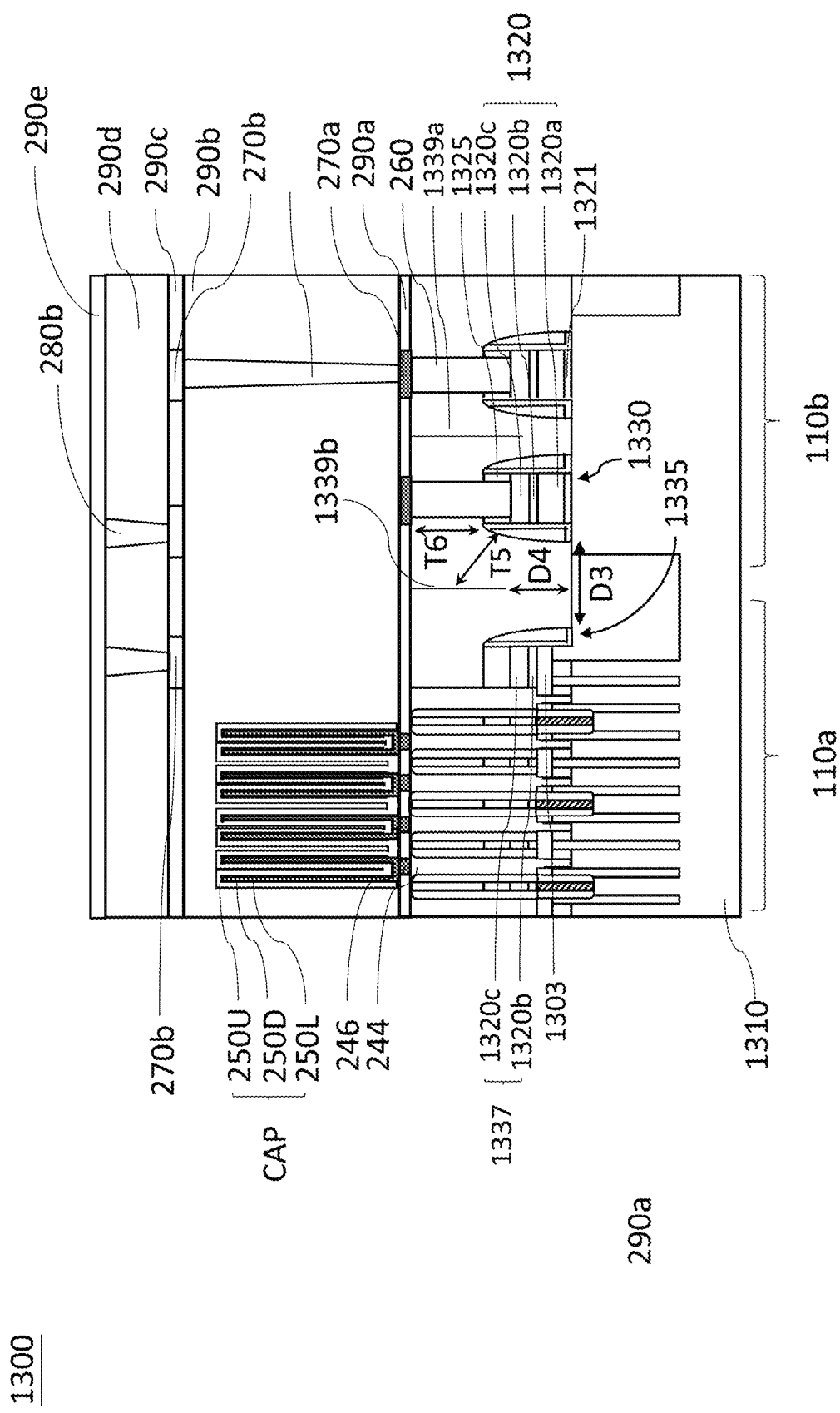
FIG. 13C illustrates a cross-sectional view of the semiconductor device in FIGS. 13A and 13B in accordance with some embodiments of the instant disclosure.

FIGS. 13A and 13B illustrate cross-sectional views of the second embodiment of a semiconductor device 1300 in FIGS. 1A and 1B taken along B-B and C-C lines, respectively, in accordance with some embodiments of the instant disclosure. FIG. 13C illustrates a cross-sectional view of the semiconductor device 1300 in FIGS. 13A and 13B in accordance with some embodiments of the instant disclosure. As illustrated in FIG. 13A, the semiconductor device 1300 of this embodiment differs from the semiconductor device 200 in that the semiconductor device 1300 is dispensed with the second dielectric layer 232b and the third dielectric layer 232c. The first dielectric layer 1332a is not conformally formed over a gate features 1330 and a dummy gate feature 1335. That is, a thickness (T6) of the first dielectric layer 1332a on the top of the gate feature 1330 and the dummy gate feature 1335 is different from the thickness (T5) of the first dielectric layer 1332a on the sidewall of gate features 1330 and dummy gate feature 1335. A seam 1339a is formed in the first dielectric layer 1332a between the gate features 1330.

A gate feature 1330 is formed above the top portion 1310d of the substrate 1310 and includes a gate dielectric 1321, a gate electrode 1320, and a hard mask 1325. The gate electrode 1320 comprises a barrier metal 1320b disposed between a gate poly 1320a and a gate metal 1320c. The dummy gate feature 1335 may have a similar structure to the gate features 1330 but does not have the function of the gate features 1330. As illustrated in FIG. 13C, the dummy gate feature 1335 is formed above the top portion of the substrate 1310 and the isolation structures 1315 and includes a dummy gate electrode 1337 and a hard mask 1325. The dummy gate electrode 1337 includes a barrier metal 1320b above the top portion of the substrate 1310 and a gate metal 1320c above the barrier metal 1320b.

As illustrated in FIG. 13C, a distance (D3) between the gate feature 1330 and the dummy gate feature 1335 is less than the thickness (T5) of the first dielectric layer 1332a. In such an embodiment, as illustrated FIG. 13C, a seam 1339b is formed in the first dielectric layer 1332a between the gate feature 1330 and the dummy gate feature 1335. The size of the seam 1339b may be effected by the distance between the gate feature 1330 and the dummy gate feature 1335. For instance, the shorter the distance (D3), the deeper the seam 1339b. In some embodiments, a bottom of the seam 1339b is sandwiched between the gate poly 1320a of the gate feature 1330 and an etch stop layer 1303. In some embodiments, a bottom of the seam 1339b is sandwiched between the barrier metal 1320b of the gate feature 1330 and the barrier metal 1320b of the dummy gate feature 1335. In some embodiments, a bottom of the seam 1339b is sandwiched between the gate metal 1320c of the gate feature 1330 and the gate metal 1320c of the dummy gate feature 1335. In some embodiments, the bottom of the seam 1339b is above the gate features 1330 and the dummy gate feature 1335.

In an embodiment, as illustrated in FIG. 13C, a distance (D4) between the substrate 1310 and the bottom of the seam 1339 is smaller than the distance (D3) between the gate feature 1330 and the dummy gate feature 1335. In such an embodiment, the distance (D4) is equal to or less than half the distance (D3). In another embodiment, a distance (D4) between the substrate 1310 and the bottom of the seam 1339 is larger than the distance (D3) between the gate feature 1330 and the dummy gate feature 1335. In such another embodiment, the distance (D4) is greater than half the distance (D3).

In some embodiments, the seam 1339b may not be formed when the gate feature 1330 and the dummy gate feature 1335 are far enough from each other. That is, the gate feature 1330 and the dummy gate feature 1335 are free of a seam therebetween. In other embodiments, the seam 1339a has a larger depth than the seam 1339b. It is noted herein that the seams 1339a, 1339b are free of the first ILD layer 290a therein.

FIGS. 14A-20A illustrate cross-sectional views of intermediate stages of fabricating the semiconductor device 1300 in FIG. 13B in accordance with some embodiments of the instant disclosure. FIGS. 14A-20A, 14B-20B, and 14C-20C illustrate cross-sectional views of intermediate stages of fabricating the semiconductor device in FIGS. 1A and 1B taken along A-A, B-B and C-C lines, respectively.

As illustrated in FIGS. 14A, 14B, and 14C, a substrate 1410 is provided. The substrate 1410 includes a bottom portion 1410c and a top portion 1410d extending from the bottom portion 1410c. An isolation structure 1415 is over the bottom portion 1410c and surrounds the top portion 1410d of the substrate 1410. Word line structures 1404 are at the top portion 1410d of substrate 1410 and the isolation structure 1415a. Each of the word line structures 1404 comprises a cell gate conductor 1404a, a cell gate dielectric 1404b, and a cell gate capping 1404c. The cell gate dielectric 1404b is arranged between the cell gate conductor 1404a and the substrate 1410. In some embodiments, the cell gate dielectric 1404b includes a thermal oxide, silicon nitride, silicon oxynitride, a high-k dielectric, or a combination thereof. The cell gate conductor 1404a may be made of a conductive material such as doped silicon, metal (e.g., tungsten, aluminum, titanium, and/or tantalum), conductive metal nitride (e.g., titanium nitride, tantalum nitride, and/or tungsten nitride) and metal-semiconductor compound (e.g., a metal silicide). The cell gate capping 1404c is above the cell gate conductor 1404a. In some embodiments, the cell gate capping 1404c may be made of insulating material such as silicon oxide and silicon nitride.

An oxide layer 1402 is over the top portion 1410d of the substrate 1410 and surrounds the cell gate cappings 1404c. The oxide layer 1402 may be made of the insulating material, such as silicon oxide, and the like. A bit line contact 1441 is between an adjacent pair of the cell gate cappings 1404c. The bit line contact 1441 may be made of conductive material such as poly silicon, metal (e.g., tungsten W), or metal silicide (e.g., nickel silicide NiSi).

An etch stop layer 1403 surrounds the bit line contact 1441 and is over the oxide layer 1402 and the cell gate cappings 1404c. The etch stop layer 1403 may be made of insulating material such as silicon oxide and silicon nitride.

A gate electrode 1420 is over the etch stop layer 1403, the bit line contact 1441, and a gate dielectric 1421. The gate electrode 1420 may comprise a gate poly 1420a, a barrier metal 1420b above the gate poly 1420a, and a gate metal 1420c above the barrier metal 1420b. In some embodiments, a thickness (T4) of the gate electrode 1420 may be about 10 nm to about 100 nm. The barrier metal 1420b may be made of conductive material such as TiN or WN or the like. In some embodiments, the barrier metal 220b has a thickness from about 1 nm to about 90 nm. In other embodiments, the barrier metal 1420b may be optional. The gate metal 1420c may be made of conductive material such as poly silicon or tungsten. The gate poly 1420a may be made of doped polysilicon.

The gate dielectric 1421 may be made of insulating material such as silicon oxide, silicon oxynitride, or a metal oxide. The metal oxide may include, for example, hafnium oxide, aluminum oxide, or titanium oxide.

A hard mask 1425 is over the gate electrode 1420 and act as the etch protect layer, e.g., during etching portions of the gate electrode 1420. In some embodiments, the hard mask 225 has a thickness from about 10 nm to about 90 nm.

Next, as illustrated in FIGS. 15A, 15B and 15C, the hard mask 1425, the gate electrode 1420, and the gate dielectric 1421 are etched to form a pair of gate features 1530. In this embodiment, each of the gate features 1530 includes the gate dielectric 1421, the gate poly 1420a above the gate dielectric 1421, the barrier metal 1420b above the gate poly 1420a, the gate metal 1420c above the barrier metal 320b, and the hard mask 1425 above the gate metal 1420c. In some embodiments, the hard mask 1425, the gate electrode 1420, and the gate dielectric 1421 are etched using an anisotropic etching process, such as plasma etching and/or reactive ion etching (RIE).

Next, as illustrated in FIGS. 16A, 16B, and 16C, a spacer layer 1660 are formed over a top surface of the hard mask 1425, on sidewalls of the etch stop layer 1403 and the gate electrode 1420, and over the gate features 1530. The spacer layer 1660 may include one or more insulating materials, such as silicon oxide, silicon nitride, and the like. In this embodiment, the spacer layer 1660 includes a first spacer layer 1660a and a second spacer layer 1660b. In some embodiments, the first spacer layer 1660a is made of silicon nitride and the second spacer layer 1660b is made of silicon oxide.

Next, as illustrated in FIGS. 17A, 17B, and 17C, the spacer layer 1660 on the top surface of the hard mask 1425 and top surfaces of the gate features 1530 are removed, leaving a gate spacer 1760 on the sidewalls of the etch stop layer 1403 and the gate electrode 1420 and sidewalls of the gate features 1530. In some embodiments, the gate spacer 1760 etching process may use an anisotropic etching process, such as plasma etching and/or reactive ion etching (RIE). In other embodiments, the gate spacer 1760 etching processes may be a 2-step process. One is wet etching process, such as HF etching to remove silicon oxide material and the other is dry etching process, such as plasma etching and/or reactive ion etching (RIE) to remove silicon nitride material.

Next, as illustrated in FIGS. 18A, 18C, and 18C, the first dielectric layer 1832a is formed over a top surface of the hard mask 1425 and on the gate spacer 1760. The first dielectric layer 1832a is not conformally formed over the gate features 1530. the first dielectric layer 1832a may be made of insulating material, such as silicon nitride, or the like. In some embodiments, the thickness (T5) of first dielectric layer 1832a may be greater than a thickness of the barrier metal 1420b. In some embodiments, the thickness (T5) of first dielectric layer 1832a may be greater than a thickness of the gate metal 1420c. In some embodiments, the thickness (T5) of first dielectric layer 1832a may be greater than a thickness of the hard mask 1425. In some embodiments, the thickness (T5) of first dielectric layer 1832a may be from about 80 nm to about 100 nm.

In an embodiment, a distance (D1) between the gate features 1530 is less than the thickness (T5) of the first dielectric layer 1832a. In such an embodiment, a seam 1839 is formed in the first dielectric layer 1832a between the gate features 1530.

In an embodiment, a distance (D2) between the substrate 1410 and the bottom of the seam 1839 is smaller than the distance (D1) between the gate features 1530. In such an embodiment, the distance (D2) is equal to or less than half the distance (D1). In another embodiment, a distance (D2) between the substrate 1410 and the bottom of the seam 1839 is larger than the distance (D1) between the gate features 1530. In such another embodiment, the distance (D2) is greater than half the distance (D1).

In some embodiments, the seam 1839 may not be formed when the gate features 1530 are far enough from each other. That is, the gate features 1530 are free of a seam 1839 therebetween.

Next, as illustrated in FIGS. 19A, 19B, and 19C, a planarization process is performed to remove the top portion of the first dielectric layer 1832a. Is some embodiments, the planarization process may be chemical-mechanical polishing (CMP). In this embodiment the thickness (T6) of the first dielectric layer 1832a on the tops of the gate features 1530 is slightly smaller than the thickness (T5) of the first dielectric layer 1832a on the sidewall of gate features 1530.

Next, as illustrated in FIGS. 20A, 20B, and 20C, portions of bit line contact 1441, the etch stop layer 1403, the barrier metal 1420b, the gate metal 1420c, the hard mask 1425, and the first dielectric layer 1832a are etched to form a dummy gate feature 2035. The dummy gate feature 2035 may have a structure similar to a structure of the gate features 1530. The dummy gate feature 2035 is formed above the top portions of the substrate 1410 and the isolation structures 1415 and includes a dummy gate electrode 2037 and the hard mask 1425. The dummy gate electrode 2037 includes the barrier metal 1420b and the gate metal 1420c. In some embodiments, the thickness (T5) of the first dielectric layer 1832a is larger than the thickness of (T3) dummy gate electrode 2037. In some embodiments, the thickness (T5) of the first dielectric layer 1832a is greater than the height (H2)

of the dummy gate feature 2035. In such an embodiment, a ratio of the thickness (T5) of the first dielectric layer 1832a to the height (H2) of the dummy gate feature 2035 is from about 1 to about 2.

A plurality of bit line stacks BL are formed over the top portion 1410d of the substrate 1410. Each of the bit line stacks BL comprises the bit line contact 1441, a first bit line conductor 2040a, a second bit line conductor 2040b, a bit line capping 2040c, and a first bit line dielectric 2040d. In some embodiments, the thickness (T5) of the first dielectric layer 1832a is larger than a thickness of the first bit line conductor 2040a. In some embodiments, the thickness (T5) of the first dielectric layer 1832a is larger than a thickness of the second bit line conductor 2040b. In some embodiments, the thickness (T5) of the first dielectric layer 1832a is larger than a thickness of the bit line capping 2040c. In some embodiments, the first dielectric layer 1832a has a substantially the same thickness (T6) as a bit line dielectric 2040d of the bit line stack BL.

Additional wiring and conductive features, such as second via 280b and a second metal line 270b are formed in additional interlayer dielectric layers, e.g., interlayer dielectric (ILD) layers 290c, 290d, over the substrate 210 to enable interconnection between circuit elements. For example, the first ILD layer 290a is deposited over the cell region 110a and the peripheral region 110b. The first metal line 270a and the landing pad 246 are formed in the first ILD layer 290a. The second ILD layer 290b is deposited over the first ILD layer 290a. The storage capacitors CAP and the first via 280a are formed in the second ILD layer 290b. The third ILD layer 290c is deposited over the second ILD layer 290b. The metal line 270b is formed in the third ILD layer 290c. The fourth ILD layer 290d is deposited over third ILD layer 290c. The second via 280b is formed in the fourth ILD layer 290d. The passivation layer 290e is deposited over the fourth ILD layer 290d.

Figure 21:
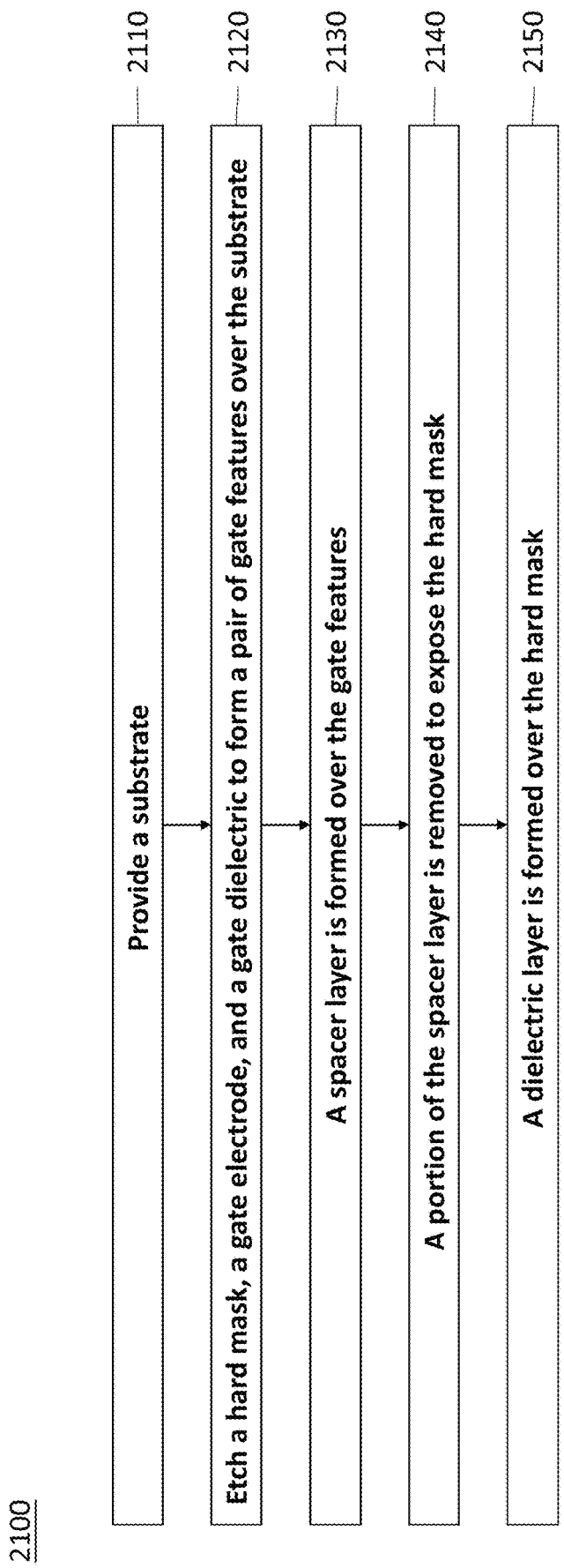
FIG. 21 illustrates a flowchart of the second embodiment of a method for fabricating a semiconductor device according to some embodiments of the instant disclosure.

FIG. 21 illustrates a flowchart of the second embodiment of a method 2100 for fabricating the semiconductor device 1300 according to some embodiments of the instant disclosure. As illustrated in FIG. 21, in block 2110, a substrate is provided. Next, in block 2120, a hard mask, a gate electrode, and a gate dielectric are etched to form a pair of gate features over the substrate. Next, in block 2130, a spacer layer is formed over the gate features. Next, in block 2140, portions of the spacer layer is removed to expose the hard mask. Next, in block 2150, a dielectric layer is formed over the hard mask.

In an embodiment, a semiconductor device comprises a substrate, a gate feature, a gate spacer, and a dielectric layer. The gate feature is above the substrate and includes a gate electrode. The gate spacer on a sidewall of the gate feature. The dielectric layer is in contact with the gate spacer and has a larger thickness than the gate electrode.

In another embodiment, a semiconductor device comprises a substrate, an isolation structure, a dummy gate feature, and a dielectric layer. The substrate includes a bottom portion and a top portion extending from the bottom portion. The isolation structure surrounds the top portion of the substrate. The dummy gate feature is above the top portion of the substrate and the isolation structure and includes a dummy gate electrode. The dielectric layer is over the dummy gate feature and has a larger thickness than the dummy gate electrode.

In another embodiment, a method for fabricating a semiconductor device comprises providing a substrate having a pair of gate features, forming a spacer layer over the gate features, removing a portion of the spacer layer to expose top surfaces of the gate features, and forming a dielectric layer over the spacer layer and the top surface of the gate feature, wherein a seam is formed in the dielectric layer between the gate features.

The embodiments shown and described above are only examples. Many details are often found in the art such as the other features of a semiconductor device. Therefore, many such details are neither shown nor described. Even though numerous characteristics and advantages of the present technology have been set forth in the foregoing description, together with details of the structure and function, the disclosure is illustrative only, and changes may be made in the detail, especially in matters of shape, size, and arrangement of the parts within the principles, up to and including the full extent established by the broad general meaning of the terms used in the claims. It will therefore be appreciated that the embodiments described above may be modified within the scope of the claims.

What is claimed is:

1. A semiconductor device comprising:
   a substrate including a bottom portion and a top portion extending from the bottom portion;
   an isolation structure surrounding the top portion of the substrate;
   a dummy gate feature above the top portion of the substrate and the isolation structure and including a dummy gate electrode;
   a first dielectric layer over the dummy gate feature and having a larger thickness than the dummy gate electrode; and
   a bit line stack including a first and second bit line conductors, wherein the first dielectric layer has a larger thickness than at least one of the first and the second bit line conductors.

2. The semiconductor device of claim 1, wherein the dummy gate feature includes a barrier metal and the first dielectric layer has a larger thickness than the barrier metal.

3. The semiconductor device of claim 1, wherein the dummy gate feature includes a hard mask and the first dielectric layer has a larger thickness than the hard mask.

4. The semiconductor device of claim 1, further comprising:
   a second dielectric layer over the first dielectric layer; and
   a third dielectric layer over the second dielectric layer, wherein the third dielectric layer has a smaller thickness than the first dielectric layer.

5. The semiconductor device of claim 1, wherein the first dielectric layer has a larger thickness than a height of the dummy gate feature.

6. A method for fabricating a semiconductor device, the method comprising:
   providing a substrate having a pair of gate features;
   forming a spacer layer over the gate features;
   removing a portion of the spacer layer to expose top surfaces of the gate features;
   forming a first dielectric layer over the spacer layer and the top surface of the gate feature, wherein a first seam is formed in the first dielectric layer between the gate features; and
   forming a bit line stack over the substrate, wherein the first dielectric layer has a larger thickness than a bit line conductor of the bit line stack.

7. The method of claim 6, further comprising forming a second dielectric layer over the first dielectric layer, wherein the first dielectric layer has a larger thickness than the second dielectric layer.

8. The method of claim 6, further comprising forming a dummy gate feature over the substrate, wherein the first dielectric layer has a larger thickness than a dummy gate electrode of the dummy gate feature.

9. The method of claim 6, further comprising forming a bit line stack over the substrate, wherein the first dielectric layer has a substantially the same thickness as a bit line dielectric of the bit line stack.

10. The method of claim 6, further comprising forming a dummy gate feature over the substrate, wherein forming the first dielectric layer is such that a second seam is between the dummy gate feature and the gate features.

\* \* \* \* \*